US012727199B2

(12) United States Patent
You et al.

(10) Patent No.: US 12,727,199 B2
(45) Date of Patent: Sep. 1, 2026

(54) SEMICONDUCTOR DEVICES

(71) Applicant: SAMSUNG ELECTRONICS CO., LTD., Suwon-si (KR)

(72) Inventors: Junggun You, Suwon-si (KR); Junki Park, Suwon-si (KR); Sunghwan Kim, Suwon-si (KR); Wandon Kim, Suwon-si (KR); Sughyun Sung, Suwon-si (KR); Hyunbae Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 361 days.

(21) Appl. No.: 18/369,236

(22) Filed: Sep. 18, 2023

(65) Prior Publication Data

US 2024/0128335 A1 Apr. 18, 2024

(30) Foreign Application Priority Data

Oct. 14, 2022 (KR) ........................ 10-2022-0132594

(51) Int. Cl.
*H01L 29/417* (2006.01)
*H10D 30/43* (2025.01)
(Continued)

(52) U.S. Cl.
CPC ......... *H10D 30/6729* (2025.01); *H10D 30/43* (2025.01); *H10D 30/6735* (2025.01);
(Continued)

(58) Field of Classification Search
CPC ........... H10D 30/6729; H10D 30/6757; H10D 30/6735; H10D 30/43; H10D 62/121; H10D 64/017
(Continued)

(56) References Cited

U.S. PATENT DOCUMENTS 9,876,030 B1 1/2018 Okano
9,985,023 B1 5/2018 Liu et al.
(Continued)

FOREIGN PATENT DOCUMENTS

KR 10-2019-0024600 3/2019
KR 10-2019-0032150 3/2019
KR 10-2020-0035896 4/2020

OTHER PUBLICATIONS

Search Report issued in corresponding Application No. EP 23202918.1 on Mar. 1, 2024.

*Primary Examiner* — Dzung Tran
(74) *Attorney, Agent, or Firm* — Morgan, Lewis & Bockius LLP

(57) ABSTRACT

A semiconductor device includes an active region on a substrate, a plurality of channel layers spaced apart from each other, a gate structure on the substrate, a source/drain region on at least one side of the gate structure, and a contact plug connected to the source/drain region. The contact plug includes a metal-semiconductor compound layer and a barrier layer on the metal-semiconductor compound layer. The contact plug includes a first inclined surface and a second inclined surface positioned where the metal-semiconductor compound layer and the barrier layer directly contact each other. The barrier layer includes first and second ends protruding towards the gate structure. The first and second ends are positioned at a level higher than an upper surface of an uppermost channel layer. An uppermost portion of the metal-semiconductor compound layer is positioned at a level higher than an upper surface of the source/drain region.

20 Claims, 22 Drawing Sheets

(51) Int. Cl.
*H10D 30/67* (2025.01)
*H10D 62/10* (2025.01)
*H10D 64/01* (2025.01)

(52) U.S. Cl.
CPC ....... *H10D 30/6757* (2025.01); *H10D 62/121* (2025.01); *H10D 64/017* (2025.01)

(58) Field of Classification Search
USPC .......................................................... 257/288
See application file for complete search history.

(56) References Cited

U.S. PATENT DOCUMENTS

| | | | | |
|---|---|---|---|---|
| 10,714,578 | B2 | 7/2020 | Huang | |
| 11,195,791 | B2 | 12/2021 | Cheng et al. | |
| 11,227,794 | B2 | 1/2022 | Wang et al. | |
| 11,335,773 | B2 | 5/2022 | Bi et al. | |
| 2017/0222014 | A1* | 8/2017 | Tak | H01L 21/76843 |
| 2018/0090583 | A1 | 3/2018 | Choi et al. | |
| 2019/0088553 | A1 | 3/2019 | Van Dal et al. | |
| 2019/0221640 | A1* | 7/2019 | Reznicek | H10D 30/0323 |
| 2019/0355585 | A1 | 11/2019 | Chang et al. | |
| 2020/0098879 | A1 | 3/2020 | Lee et al. | |
| 2021/0104612 | A1* | 4/2021 | Bae | H10D 30/6219 |
| 2021/0233847 | A1* | 7/2021 | Kim | H10D 64/256 |
| 2021/0391464 | A1* | 12/2021 | Bae | H10D 30/43 |
| 2022/0310805 | A1* | 9/2022 | Chun | H10D 30/6219 |
| 2022/0320090 | A1* | 10/2022 | Hsu | H10D 30/6739 |
| 2022/0320301 | A1 | 10/2022 | Bae et al. | |

* cited by examiner 140
143
142
141
120
110
101
105
II
II'
I
I'
Z
X
Y

SEMICONDUCTOR DEVICES

CROSS-REFERENCE TO RELATED APPLICATION(S)

This application claims priority under 35 U.S.C. § 119 to Korean Patent Application No. 10-2022-0132594, filed on Oct. 14, 2022 in the Korean Intellectual Property Office, the disclosure of which is incorporated by reference in its entirety herein.

1. TECHNICAL FIELD

The present disclosure relates to a semiconductor device.

2. DISCUSSION OF RELATED ART

The integration level of semiconductor devices has increased as the demand for high performance, high speed, and multifunctionality of semiconductor devices has increased. Patterns having a fine width or a fine separation distance are desired to provide an increased integration level. In addition, there has been development of a semiconductor device having a 3-dimensional channel structure to overcome the limitations of operating characteristics due to the size reduction of a planar metal oxide semiconductor field-effect transistors (MOSFET).

SUMMARY

One or more embodiments of the present disclosure provide a semiconductor device having increased electrical characteristics.

According to an embodiment of the present disclosure, a semiconductor device includes an active region on a substrate. The active region extends in a first direction parallel to an upper surface of the substrate. A plurality of channel layers is on the active region. The plurality of channel layers is spaced apart from each other in a vertical direction perpendicular to the upper surface of the substrate. A gate structure is on the substrate and extends in a second direction parallel to the upper surface of the substrate and crossing the first direction. The gate structure crosses the active region and the plurality of channel layers. The gate structure respectively encloses the plurality of channel layers. A source/drain region is on the active region on at least one side of the gate structure and directly contacts the plurality of channel layers. A contact plug is connected to the source/drain region. The contact plug includes a metal-semiconductor compound layer directly contacting the source/drain regions, a barrier layer on the metal-semiconductor compound layer, and a plug conductive layer on the barrier layer. The contact plug includes a first inclined surface and a second inclined surface positioned where the metal-semiconductor compound layer and the barrier layer directly contact each other. The barrier layer includes a first end and a second end protruding towards the gate structure on an outer side surface. The first end and the second end are positioned at a level higher than an upper surface of an uppermost channel layer among the plurality of channel layers. An uppermost portion of the metal-semiconductor compound layer is positioned at a level higher than an upper surface of the source/drain region.

According to an embodiment of the present disclosure, a semiconductor device includes an active region on a substrate. The active region extends in a first direction parallel to an upper surface of the substrate. A plurality of channel layers is on the active region. The plurality of channel layers is spaced apart from each other in a vertical direction perpendicular to the upper surface of the substrate. A gate structure is on the substrate and extends in a second direction parallel to the upper surface of the substrate and crossing the first direction. The gate structure crosses the active region and the plurality of channel layers. The gate structure respectively encloses the plurality of channel layers. A source/drain region is on the active region on at least one side of the gate structure and directly contacts the plurality of channel layers. A contact plug is connected to the source/drain region. The contact plug includes a metal-semiconductor compound layer directly contacting the source/drain region, a barrier layer on the metal-semiconductor compound layer, and a plug conductive layer on the barrier layer. The barrier layer includes a first end and a second end protruding towards the gate structure on an outer side surface. The first end and the second end are positioned at a level higher than an upper surface of the source/drain region.

According to an embodiment of the present disclosure, a semiconductor device includes an active region on a substrate. The active region extends in a first direction parallel to an upper surface of the substrate. A gate structure is on the substrate and extends in a second direction parallel to the upper surface of the substrate and crossing the first direction. The gate structure crosses the active region. A source/drain region is on the active region on at least one side of the gate structure. A contact plug is connected to the source/drain region. The contact plug includes a metal-semiconductor compound layer directly contacting the source/drain region, a barrier layer, and a plug conductive layer on the barrier layer. The barrier layer includes a first end and a second end protruding towards the gate structure on an outer side surface. The first end and the second end are positioned at a level higher than the upper surface of the source/drain region. The metal-semiconductor compound layer has a first thickness in a central region, and a second thickness less than the first thickness in a peripheral region outside of the central region.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION OF EMBODIMENTS

Hereinafter, example embodiments will be described with reference to the accompanying drawings.

Figure 1:
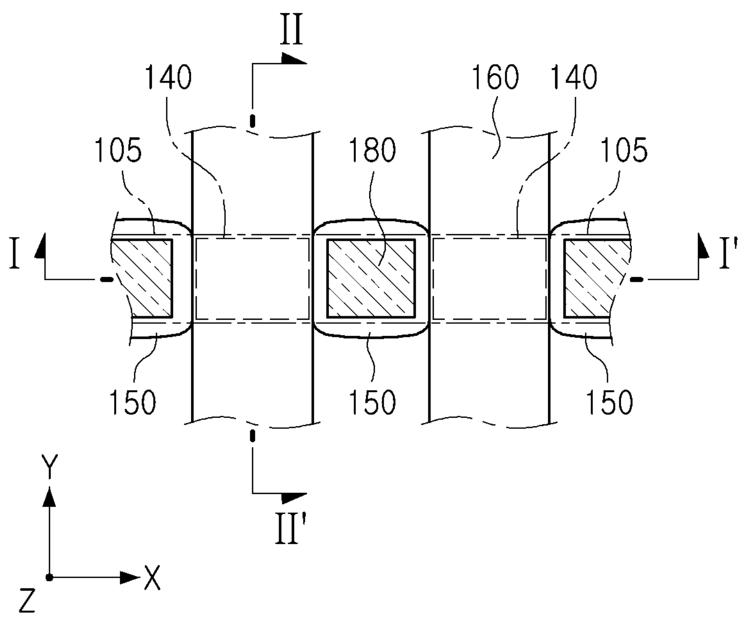
FIG. 1 is a plan view illustrating a semiconductor device according to an embodiment of the present disclosure.

FIG. 1 is a plan view illustrating a semiconductor device according to an embodiment.

Figure 2A:
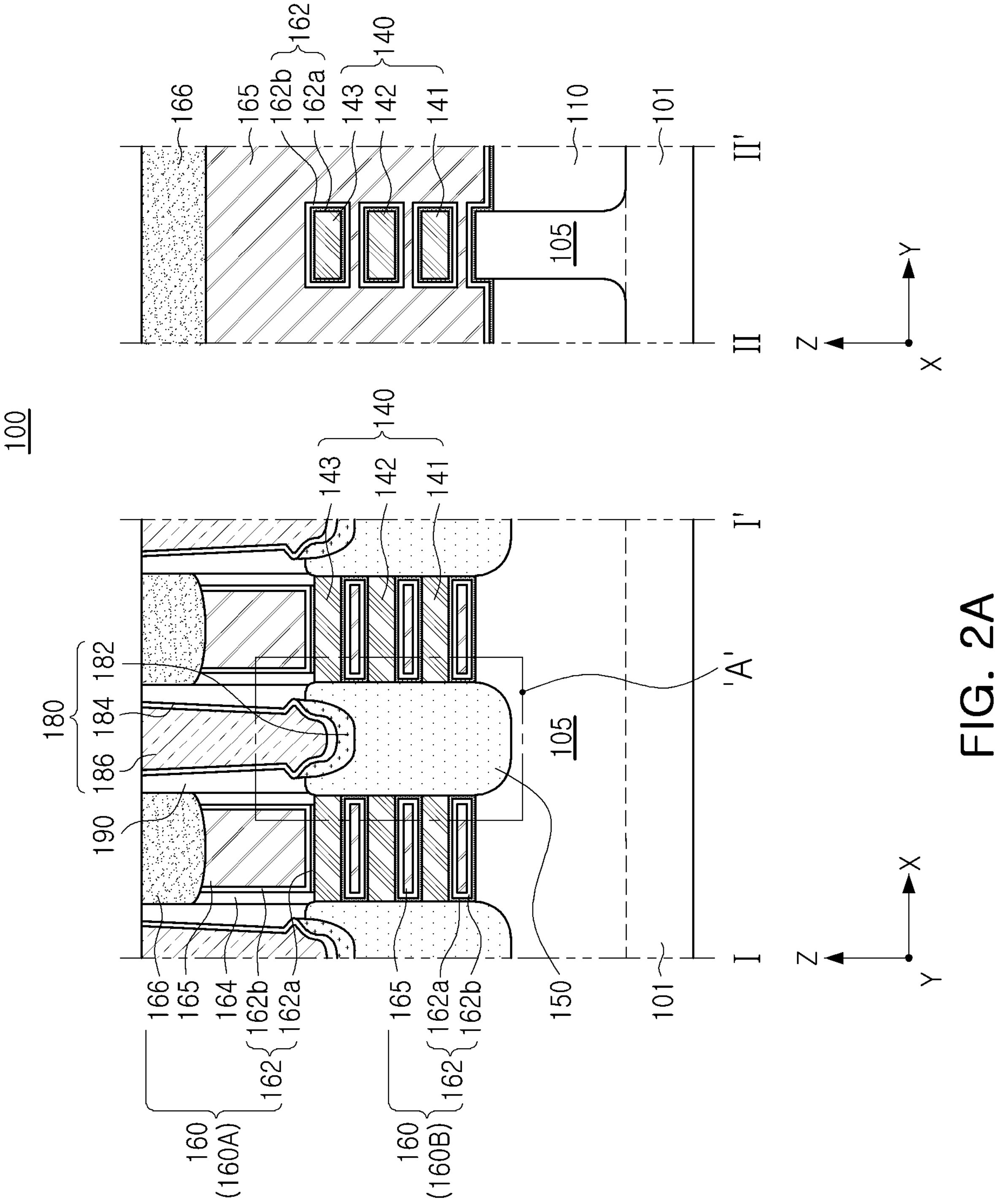
FIG. 2A is a cross-sectional view illustrating a semiconductor device taken along lines I-I' and II-II' of FIG. 1 according to an embodiment of the present disclosure.

FIG. 2A is a cross-sectional view illustrating a semiconductor device according to an embodiment. FIG. 2A illustrates cross-sections of the semiconductor device of FIG. 1 taken along lines I-I' and II-II', respectively.

Figure 2B:
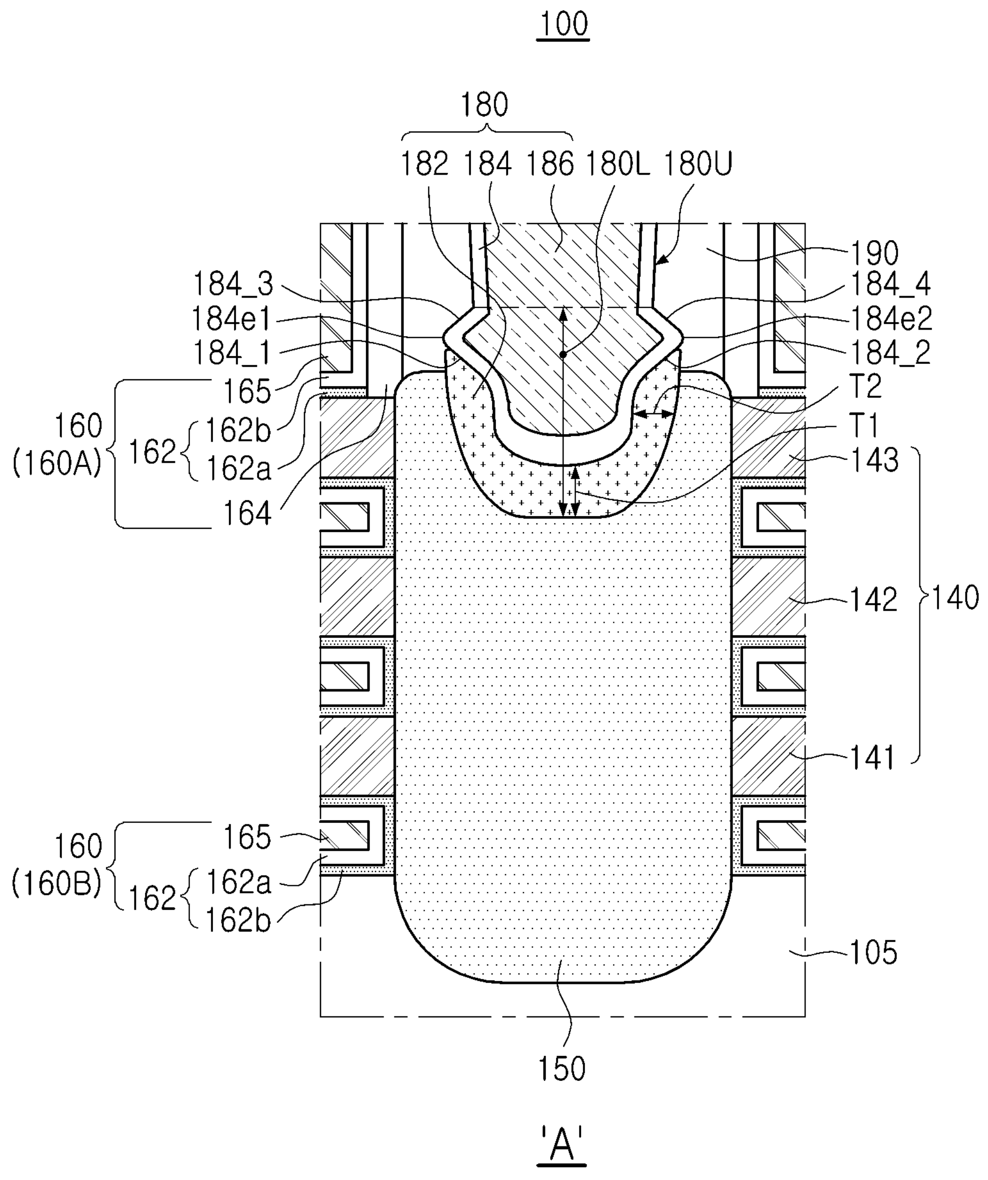
FIG. 2B is a partially enlarged view illustrating a portion of a semiconductor device of area 'A' of FIG. 2A according to an embodiment of the present disclosure.

FIG. 2B is a partially enlarged view illustrating an enlarged portion of a semiconductor device according to an embodiment. In FIG. 2B, the 'A' area of FIG. 2A is enlarged and illustrated.

For convenience of description, only the main components of the semiconductor device are illustrated in FIGS. 1 to 2B.

Referring to FIGS. 1 to 2B, a semiconductor device 100 may include a substrate 101, an active region 105 on the substrate 101, a channel structure 140 including a plurality of channel layers 141, 142, and 143 spaced apart from each other vertically (e.g., in the Z-direction) on the active region 105, a gate structure 160 extending across the active region 105, a source/drain region 150 in direct contact with the plurality of channel layers 141, 142, and 143, and a contact plug 180 connected to the source/drain region 150. The semiconductor device 100 may further include device isolation layers 110 and an interlayer insulating layer 190. The gate structure 160 may include gate spacer layers 164, first and second gate dielectric layers **162*a* and 162*b*, a gate electrode 165, and a gate capping layer 166**.

In the semiconductor device 100, the active region 105 may have a fin structure, and the gate electrode 165 may be disposed between the active region 105 and the channel structure 140, between the plurality of channel layers 141, 142, and 143 of the channel structures 140, and on an upper portion of the channel structure 140. Accordingly, the semiconductor device 100 may include a gate-all-around type field effect transistor by a channel structure 140, a source/drain region 150, and a gate structure 160, for example, a Multi Bridge Channel FET (MBCFET™). In an embodiment, the transistors may be, for example, NMOS transistors.

The substrate 101 may have an upper surface extending in the X- and Y-directions. In an embodiment, the substrate 101 may include a semiconductor material, such as a Group IV semiconductor, a Group III-V compound semiconductor, or a Group II-VI compound semiconductor. For example, the group IV semiconductor may include silicon, germanium, or silicon-germanium. The substrate 101 may be provided as a bulk wafer, an epitaxial layer, a Silicon-On-Insulator (SOI) layer, or a Semiconductor-On-Insulator (SeOI) layer. However, embodiments of the present disclosure are not necessarily limited thereto.

The active region 105 is defined by the device isolation layer 110 within the substrate 101 and may be disposed to extend in a first direction, such as an X-direction that is parallel to an upper surface of the substrate 101. In an embodiment, the active region 105 may have a structure protruding from the substrate 101 (e.g., in the Z-direction). An upper end of the active region 105 may protrude to a predetermined height from the upper surface of the device isolation layer 110. In an embodiment, the active region 105 may be formed of a portion of the substrate 101 or may include an epitaxial layer grown from the substrate 101. However, on both sides of the gate structure 160, the active region 105 on the substrate 101 may be partially recessed, and a source/drain region 150 may be disposed on the recessed active region 105. The active region 105 may include impurities or doped regions including impurities.

In an embodiment, the channel structure 140 may include two or more plurality of channel layers spaced apart from each other in a direction perpendicular to the upper surface of the active region 105, such as the Z-direction, on the active region 105. For example, in an embodiment the channel structure 140 may include first to third channel layers 141, 142 and 143. The first to third channel layers 141, 142, and 143 may be spaced apart from the upper surface of the active region 105 (e.g., in the Z-direction) while being connected to the source/drain region 150. In an embodiment, the first to third channel layers 141, 142, and 143 may have the same or a similar width as the active region 105 in the Y-direction, and may have the same or a similar width as the gate structure 160 in the X-direction. However, embodiments of the present disclosure are not necessarily limited thereto. For example, in an embodiment the first to third channel layers 141, 142, and 143 may have reduced widths such that side surfaces are positioned under the gate structure 160 in the X-direction. As a result, a contact area between the source/drain region 150 and the plurality of channel layers 141, 142, and 143 may be reduced.

In an embodiment, the first to third channel layers 141, 142, and 143 may be formed of a semiconductor material, and may include, for example, at least one material selected from silicon (Si), silicon germanium (SiGe), and germanium (Ge). In an embodiment, the first to third channel layers 141, 142, and 143 may be formed of the same material as the substrate 101. The number and shape of the channel layers 141, 142, and 143 constituting one channel structure 140 may be variously changed in embodiments of the present disclosure (see FIGS. 9A and 9B).

The gate structure 160 crosses the active region 105 and the plurality of channel layers 141, 142, and 143 on top of the active region 105, and may be disposed to extend in one direction, such as in the Y-direction. Channel regions of transistors may be formed in the active region 105 and the plurality of channel layers 141, 142, and 143 crossing the gate structure 160. The gate structure 160 may include an upper portion 160A disposed on the uppermost channel layer among the plurality of channel layers 141, 142, and 143, and lower portions 160B disposed below each of the plurality of channel layers 141, 142, and 143, in a region vertically overlapping the plurality of channel layers 141, 142, and 143. Throughout the specification, terms such as 'lower' and 'upper' are used to distinguish relative positions, and embodiments of the present disclosure are not necessarily limited by these terms. According to an embodiment, the lowermost portions of the source/drain regions 150 may be disposed at a level lower than that of the lowermost portion 160B of the gate structure 160. The gate structure 160 may include a gate electrode 165, first and second gate dielectric layers 162*a* and 162*b* between the gate electrode 165 and the plurality of channel layers 141, 142, and 143, gate spacer layers 164 on the sides of the gate electrode 165, and a gate capping layer 166 on the upper surface of gate electrode 165.

The first and second gate dielectric layers 162*a* and 162*b* may be disposed between the active region 105 and the gate electrode 165 and between the plurality of channel layers 141, 142 and 143 and the gate electrode 165, and may be disposed to cover at least some of the surfaces of the gate electrode 165. For example, in the upper portion 160A of the gate structure 160, the first gate dielectric layer 162*a* may be disposed on the lower surface of the gate electrode 165 and the lower surface of the second gate dielectric layer 162*b*. The second gate dielectric layer 162*b* may be disposed to surround all surfaces of the gate electrode 165 except for an uppermost surface thereof. The first and second gate dielectric layers 162*a* and 162*b* may extend between the gate electrode 165 and the gate spacer layers 164. However, embodiments of the present disclosure are not necessarily limited thereto. The first and second gate dielectric layers 162*a* and 162*b* may have the same or different thicknesses from each other.

The first and second gate dielectric layers 162*a* and 162*b* may be formed of the same material or may include different materials. In an embodiment, the first and second gate dielectric layers 162 and 163 may include oxide, nitride, or a high-κ material. The high-κ material may mean a dielectric material having a higher dielectric constant than silicon oxide ($SiO_2$). In an embodiment, the high dielectric constant material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed to fill a gap between the plurality of channel layers 141, 142, and 143 on the upper portion of the active region 105 and extend to the upper portion of the plurality of channel layers 141, 142, and 143. For example, the gate structure 160 may enclose each of the plurality of channel layers 141, 142, 143. The gate electrode 165 may be spaced apart from the plurality of channel layers 141, 142, and 143 by the first and second gate dielectric layers 162*a* and 162*b*. The gate electrode 165 may include a conductive material. For example, in an embodiment the gate electrode 165 may include a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon.

The gate electrode 165 may be composed of two or more multilayer structures. Gate spacer layers 164 may be disposed on both sides of the gate electrode 165 (e.g., in the X-direction). The gate spacer layers 164 may insulate the source/drain regions 150 and the gate electrode 165. In an embodiment, the gate spacer layers 164 may have a multilayer structure. In an embodiment, the gate spacer layers 164 may include at least one of oxide, nitride, oxynitride, and low-κ dielectric.

The gate capping layer 166 may be disposed on (e.g., disposed directly thereon in the Z-direction) the gate electrode 165. The gate capping layer 166 may be disposed to extend along the upper surface of the gate electrode 165 in the second direction, for example, in the Y-direction. Side surfaces of the gate capping layer 166 may be surrounded by gate spacer layers 164. In an embodiment, an upper surface of the gate capping layer 166 may be substantially coplanar with an upper surface of the gate spacer layers 164. However, embodiments of the present disclosure are not necessarily limited thereto. In an embodiment, the gate capping layer 166 may be formed of oxide, nitride, and oxynitride, such as at least one of SiO, SiN, SiCN, SiOC, SiON, and SiOCN. However, embodiments of the present disclosure are not necessarily limited thereto.

The source/drain region 150 may be disposed on the active region 105 at both sides of the plurality of channel layers 141, 142, and 143 (e.g., in the X-direction). However, embodiments of the present disclosure are not necessarily limited thereto and the source/drain region 150 may be disposed on at least one side of the plurality of channel layers 141, 142, 143 in some embodiments. The source/drain region 150 may be provided as a source region or a drain region of a transistor. In an embodiment, the source/drain region 150 may be disposed by partially recessing an upper portion of the active region 105. However, embodiments of the present disclosure are not necessarily limited thereto and the recess may not be recessed or may be recessed in various different depths in some embodiments. In an embodiment, outer side surfaces of the source/drain regions 150 protrude toward the plurality of channel layers 141, 142, and 143. For example, in an embodiment the source/drain regions 150 may include protrusions protruding toward the plurality of channel layers 141, 142, and 143 at the same level as the plurality of channel layers 141, 142, and 143. Surfaces contacting the source/drain regions 150 and the first and second gate dielectric layers 162*a* and 162*b* may have a rounded shape. The source/drain region 150 may include epitaxial layers disposed along respective side surfaces of the plurality of channel layers 141, 142, and 143. The source/drain region 150 may include a plurality of epitaxial layers. However, embodiments of the present disclosure are not necessarily limited thereto. In an embodiment, the source/drain region 150 may be a semiconductor layer including silicon (Si) and/or germanium (SiGe). The source/drain regions 150 may include impurities of different types and/or concentrations. For example, the source/drain regions 150 may include N-type doped silicon (Si) and/or P-type doped silicon germanium (SiGe). In an embodiment, the lower surface of the source/drain region 150 may have a rounded shape in a cross section in the X-direction. However, embodiments of the present disclosure are not necessarily limited thereto. In some embodiments, the source/drain region 150 may include a plurality of regions including different concentrations of elements and/or doping elements. In an embodiment, the source/drain region 150 may have a circular, elliptical, pentagonal, hexagonal, or similar shape in cross section in the Y-direction. However, embodiments of the present disclosure are not necessarily limited thereto and the source/drain region 150 may have various shapes, for example, any one of a polygonal shape, a circular shape, a rectangular shape, an irregular shape, etc.

The contact plugs 180 may pass through at least a portion of the interlayer insulating layer 190 to directly contact the source/drain region 150 and apply electrical signals to the source/drain region 150. In an embodiment, the contact plugs 180 may be disposed on the source/drain region 150 and may be disposed to have a longer length in the Y-direction than the source/drain region 150. In an embodiment, the contact plugs 180 may have inclined side surfaces in which the width of the lower part is narrower than the width of the upper part according to the aspect ratio. However, embodiments of the present disclosure are not necessarily limited thereto. In an embodiment, the contact plugs 180 may be symmetrical about a central axis perpendicular to the upper surface of the substrate 101. However, embodiments of the present disclosure are not necessarily limited thereto. The contact plugs 180 may be disposed to recess the source/drain region 150 to a predetermined depth. According to an embodiment, the contact plug 180 may include a lower portion 180L and an upper portion 180U disposed on the lower portion 180L (e.g., disposed directly thereon in the Z-direction). A width of the lowermost portion of the upper portion 180U of the contact plug 180 in the X-direction may be less than a width between a first end **184*e*1 and a second end 184*e*2 of the contact plug 180 in the X-direction. The contact plug 180 may have a maximum width in the X-direction between the first end 184*e*1 and the second end 184*e*2. In an embodiment, the contact plug 180 may have a width in the X-direction (e.g., a width between opposite outer side surfaces of the barrier layer 184) that is less than the maximum width that gradually increases or decreases from a level above the first and second ends 184*e*1, 184*e*2**.

In an embodiment, the contact plugs 180 may include a metal-semiconductor compound layer 182 disposed at the bottom, a barrier layer 184 disposed along the sidewalls on the metal-semiconductor compound layer 182, and a plug conductive layer 186 on the barrier layer 184. An upper portion 180U of the contact plug 180 may include a barrier layer 184 and a plug conductive layer 186. The lower portion 180L of the contact plug 180 may have the first to fourth inclined surfaces 184_1, 184_2, 184_3 and 184_4, the first end **184*e*1, and the second end 184*e*2, and may include the metal-semiconductor compound layer 182, the barrier layer 184, and the plug conductive layer 186. The contact plugs 180 may include first inclined surfaces 184_1 and second inclined surfaces 184_2 with which the metal-semiconductor compound layer 182 and the barrier layer 184 come into direct contact therewith. According to an embodiment, the first inclined surface 184_1 and the second inclined surface 1842 may not be parallel to the upper surface of the source/drain region 150. For example, the first inclined surface 184_1 and the second inclined surface 184_2 may be inclined with respect to the upper surface of the source/drain region 150. In an embodiment, the first inclined surface 184_1 and the second inclined surface 184_2 may not be parallel to the upper surface of the substrate 101. In an embodiment the first inclined surface 1841 may be symmetrical with the second inclined surface 184_2 and the third inclined surface 184_3 may be symmetrical with the fourth inclined surface 184_4**.

In an embodiment, the metal-semiconductor compound layer 182 may be, for example, a metal silicide layer. For example, in an embodiment, the metal-semiconductor compound layer 182 may include, for example, at least one compound selected from tungsten silicide, titanium silicide, and tantalum silicide. An uppermost portion of the metal-semiconductor compound layer 182 may be positioned at a higher level than an upper surface of the source/drain region 150. For example, the uppermost portion of the metal-semiconductor compound layer 182 may be farther from an upper surface of the substrate 101 than an upper surface of the source/drain region 150. According to an embodiment, at least a portion of the lower portion of the metal-semiconductor compound layer 182 may have a flat shape. However, embodiments of the present disclosure are not necessarily limited thereto. The metal-semiconductor compound layer 182 may directly contact the source/drain region 150. According to an embodiment, the thickness of the metal-semiconductor compound layer 182 may not be conformal. For example, the metal-semiconductor compound layer may have a first thickness T1 in a central region, and may have a second thickness (T2) that is less than the first thickness (T1) in the peripheral area outside the central area. However, embodiments of the present disclosure are not necessarily limited thereto.

In an embodiment, the barrier layer 184 may include, for example, a metal nitride such as titanium nitride (TiN), tantalum nitride (TaN), or tungsten nitride (WN). In an embodiment, the barrier layer 184 may conformally cover at least a portion of the sidewall of the contact plug 180. For example, the barrier layer 184 may be conformally formed on the side surface of the contact plug 180. The barrier layer 184 may include a first end **184*e*1 and a second end 184*e*2 (e.g., opposite to each other in the X-direction) protruding toward the upper portion 160A of the gate structure 160 on an outer side surface. The first end 184*e*1 and the second end 184*e*2 may be positioned at a level higher than the upper surface of the uppermost channel layer 143 among the plurality of channel layers 141, 142, and 143. The first end 184*e*1 and the second end 184*e*2 may also be positioned at a level higher than the upper surface of the source/drain region 150. The first end 184*e*1 and the second end 184*e*2 may be disposed on (e.g., disposed directly above in the Z-direction) the uppermost portion of the metal-semiconductor compound layer 182. In an embodiment, the first end 184*e*1 and the second end 184*e*2 may have a rounded shape. For example, the first end 184*e*1 may be curved at a portion where the first inclined surface 184_1 and the third inclined surface 184_3 meet, and the second end 184*e*2 may be curved at a portion where the second inclined surface 184_2 and the fourth inclined surface 184_4 meet. The barrier layer 184 may have a shape in which a length in the Z-direction decreases toward the first end 184*e*1 and the second end 184*e*2**.

In an embodiment, the plug conductive layer 186 may include, for example, a metal material such as aluminum (Al), tungsten (W), or molybdenum (Mo). In an embodiment, since the barrier layer 184 may conformally cover at least a portion of the sidewall of the contact plug 180, the plug conductive layer 186 may have portions (e.g., protruding regions) that protrude towards the first end **184*e*1 and the second end 184*e*2 to correspond to the barrier layer 184 at the first end 184*e*1 and the second end 184*e*2. According to some embodiments, the contact plug 180 may be disposed to pass through at least a portion of the source/drain region 150, such as an upper portion. In embodiments of the present disclosure, the number and arrangement of conductive layers constituting the contact plugs 180 may be variously changed. In addition, a wiring structure such as a contact plug may be further disposed on the gate electrode 165. A wiring structure connected to the contact plugs 180 may be further disposed on the contact plugs 180. The plug conductive layer 186 may have a shape in which a length in the Z-direction decreases towards the first end 184*e*1 and the second end 184*e*2**.

The device isolation layer 110 may define an active region 105 in the substrate 101. The device isolation layer 110 may be formed by, for example, a shallow trench isolation (STI) process. In an embodiment, the device isolation layer 110 may further include a region having a step below the substrate 101 and extending more deeply. The device isolation layer 110 may partially expose an upper portion of the active region 105. According to an embodiment, the device isolation layer 110 may have a curved upper surface having a higher level as it gets closer to the active region 105. The device isolation layer 110 may be formed of an insulating material. For example, in an embodiment the device isolation layer 110 may be an oxide, a nitride, or a combination thereof. However, embodiments of the present disclosure are not necessarily limited thereto.

The interlayer insulating layer 190 may be disposed to cover the source/drain regions 150, the gate structure 160 and the device isolation layer 110. In an embodiment, the interlayer insulating layer 190 may include, for example, at least one of oxide, nitride, oxynitride, and low-κ dielectric. In an embodiment, the contact plug 180 may include a third inclined surface 184_3 and a fourth inclined surface 184_4 where the barrier layer 184 and the interlayer insulating layer 190 contact each other. Accordingly, the first end **184*e*1 may be a portion at which the first inclined surface 184_1 and the third inclined surface 184_3 meet each other, and the second end 184*e*2 may be a portion at which the second inclined surface 184_2 and the fourth inclined surface 184_4 meet each other. In an embodiment, the first end 184*e*1 and the second end 184*e*2 may be spaced apart from the upper portion 160A of the gate structure 160 by the interlayer insulating layer 190. In an embodiment, the third inclined surface 184_3 and the fourth inclined surface 184_4 may not be parallel to the upper surface of the substrate 101**.

In the description of the following embodiments, descriptions overlapping with those described above with reference to FIGS. 1 to 2B may be omitted for economy of description.

FIGS. 3 to 8 are partially enlarged views of a semiconductor device according to embodiments of the present disclosure. Next, with reference to FIGS. 3 to 8, various modified embodiments of the partially enlarged area indicated by 'A' in FIG. 2A will be described. Hereinafter, in the description with reference to FIGS. 3 to 8, the deformed components among the components described above will be mainly described for economy of description.

Figure 3:
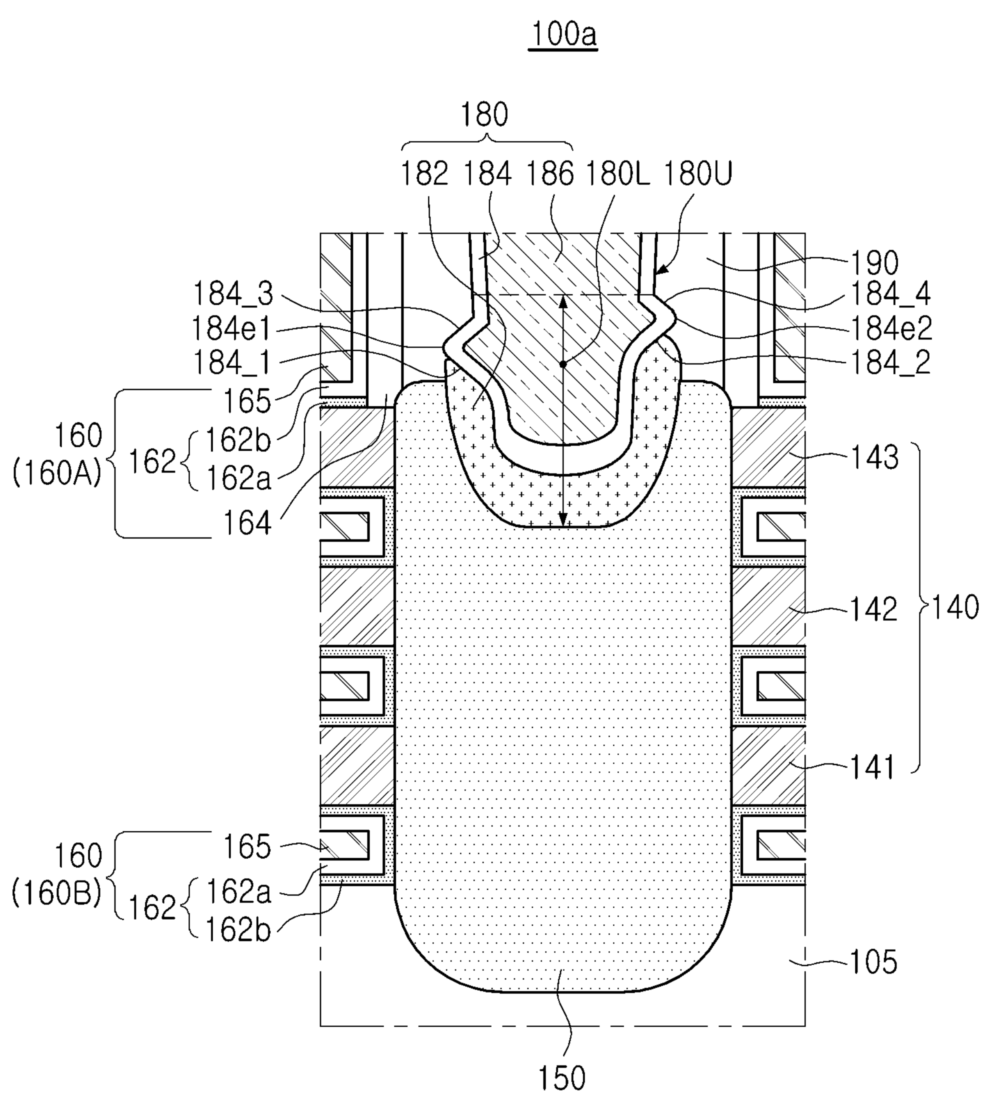
FIG. 3 is a partially enlarged view illustrating a semiconductor device according to an embodiment of the present disclosure.

Referring to FIG. 3, in the semiconductor device **100*a*, the contact plug 180 may not be left-right symmetric with respect to the central axis. For example, in an embodiment, the first end 180*e*1 may be positioned on a level different from the level at which the second end 180*e*2 is positioned. For example, the first end 180*e*1 may be positioned at a level higher than the upper surface of the source/drain region 150, but may be positioned at a level different from the level at which the second end 180*e*2 is located. For example, as shown in an embodiment of FIG. 3, the first end 180*e*1 may be positioned on a level lower than the level at which the second end 180*e*2 is positioned. However, embodiments of the present disclosure are not necessarily limited thereto. According to an embodiment, the first end 184*e*1 and the second end 184*e*2 may have different degrees of protrusion towards the upper portion 160A of the gate structure 160. For example, in an embodiment the first end 184*e*1 may protrude more towards the upper portion 160A of the gate structure 160 than the second end 184*e*2. For example, the distance in the X-direction between the outermost periphery of the first end 184*e*1 and the gate electrode 165 closest thereto may be less than the distance in the X-direction between the outermost periphery of the second end 184*e*2 and the gate electrode 165** closest thereto. The above features may also be applied to other embodiments.

Figure 4:
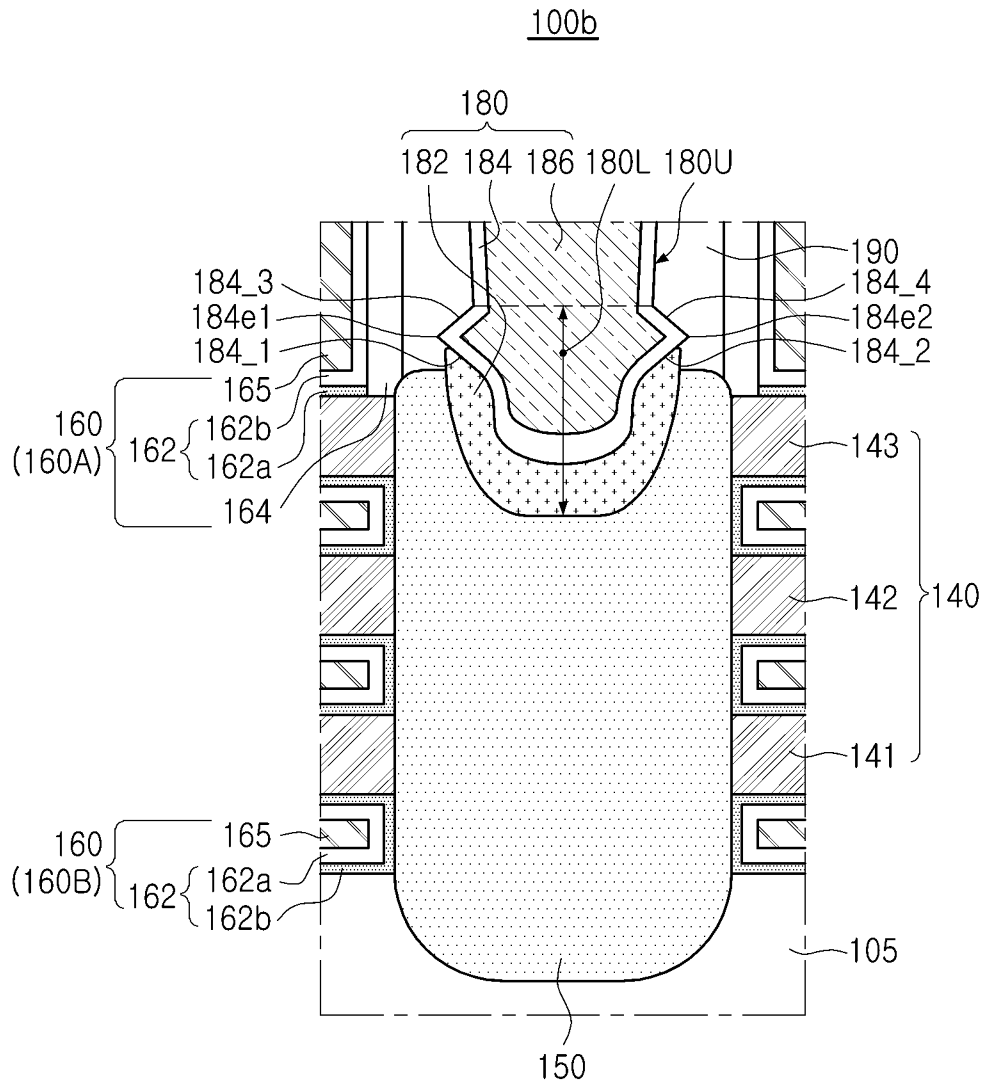
FIG. 4 is a partially enlarged view illustrating a semiconductor device according to an embodiment of the present disclosure.

Referring to FIG. 4, in the semiconductor device **100*b*, the first end 180*e*1 and the second end 180*e*2 may not be rounded and may instead have a pointed shape. For example, the first end 180*e*1 may be a portion where the first inclined surface 184_1 and the third inclined surface 184_3 directly meet and forms an angle without being bent (e.g., a triangular shape pointing towards the gate structure 160). The second end 180*e*2 may be a portion where the second inclined surface 184_2 and the fourth inclined surface 184_4 directly meet and forms an angle without being bent (e.g., a triangular shape pointing towards the gate structure 160). In the manufacturing process step described later with reference to FIG. 11I, the shapes of the first end 180*e*1 and the second end 180*e*2** may be formed in various manners, as described above, by controlling a chemical oxide removal (COR) process and $H_2$ gas.

Figure 5:
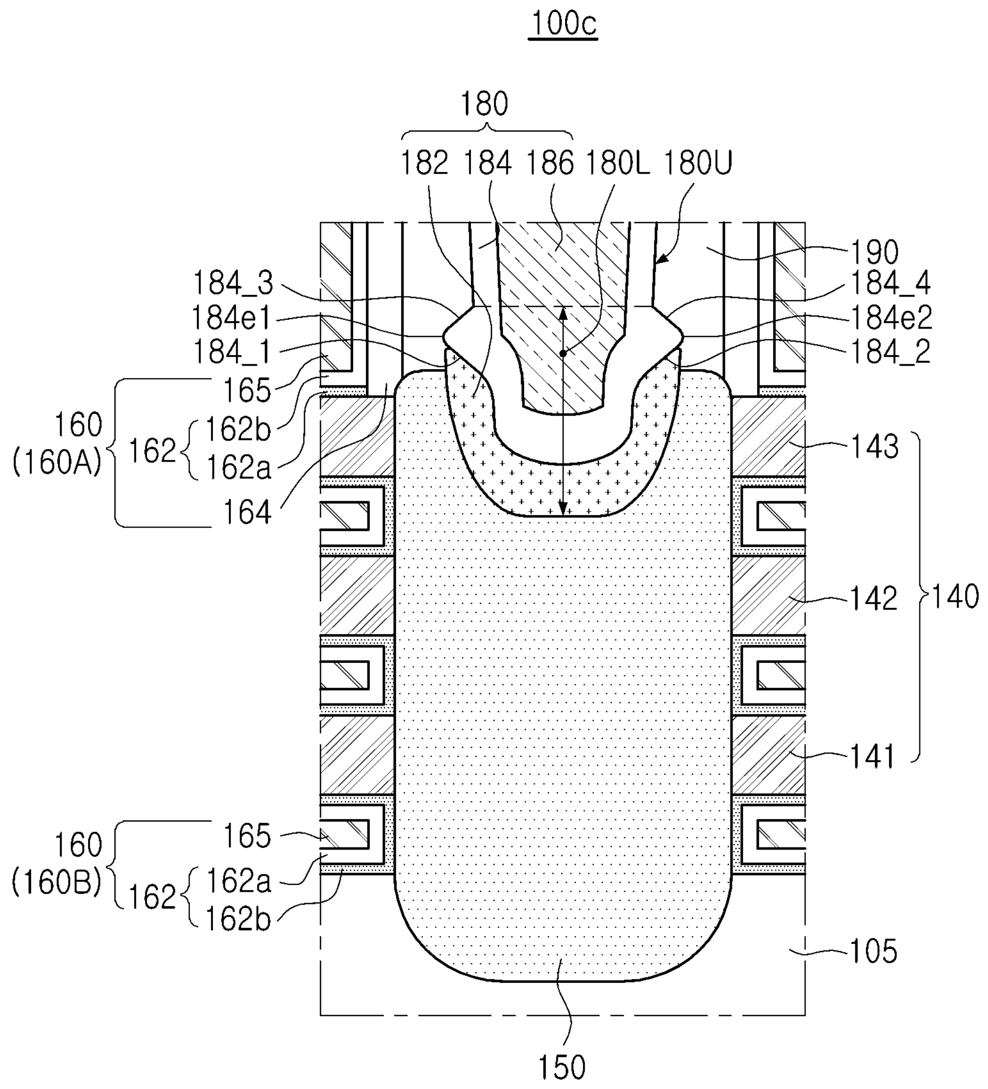
FIG. 5 is a partially enlarged view illustrating a semiconductor device according to an embodiment of the present disclosure.

Referring to FIG. 5, in the semiconductor device **100*c*, the barrier layer 184 is formed thicker than the barrier layer 184 of the semiconductor device 100 of an embodiment of FIG. 2A, and the plug conductive layer 186 may not protrude toward the first end 180*e*1 and the second end 180*e*2. The lower portion of the plug conductive layer 186 may have a flat shape. However, embodiments of the present disclosure are not necessarily limited thereto and the lower portion of the plug conductive layer 186** may have a rounded shape in some embodiments.

In the description of the following embodiments, descriptions overlapping with those described above with reference to FIG. 5 will be omitted for economy of description.

Figure 6:
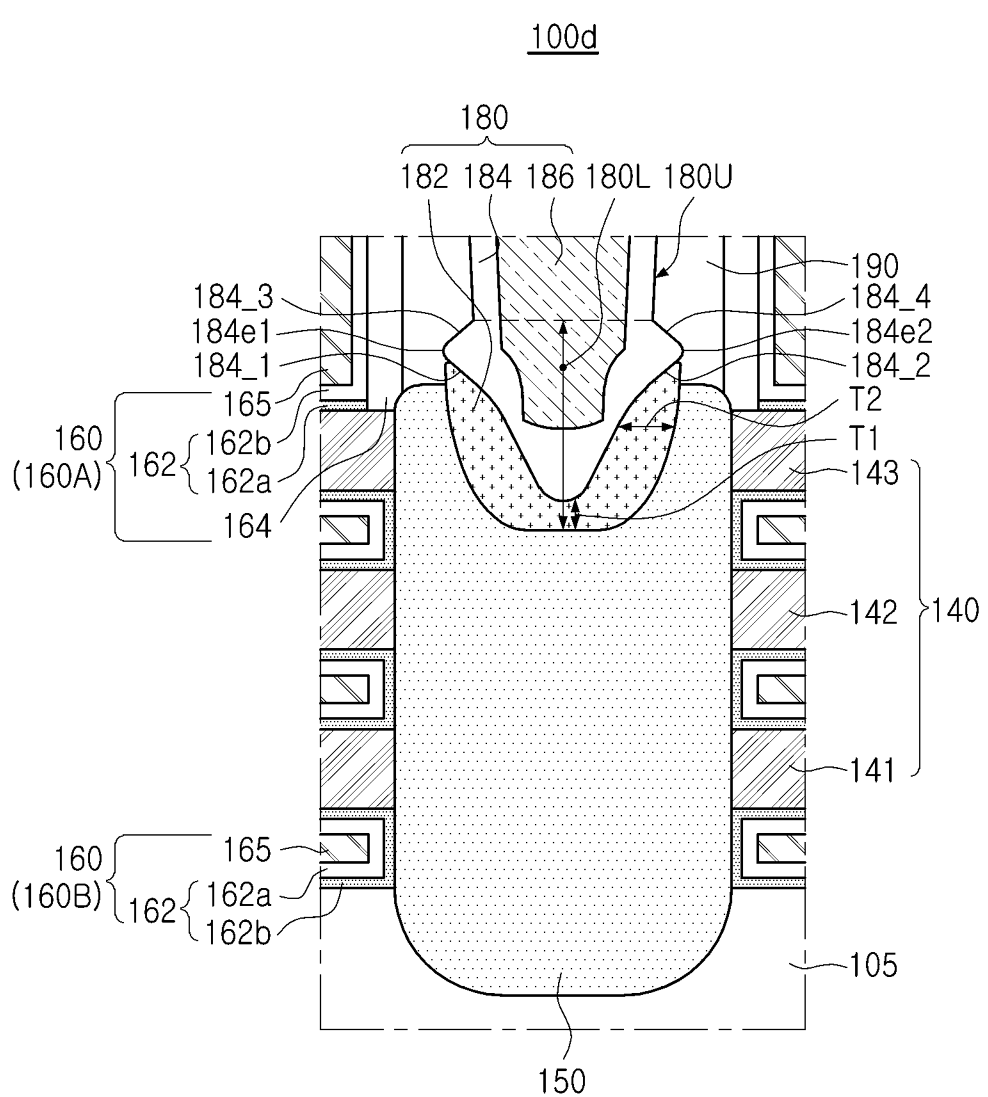
FIG. 6 is a partially enlarged view illustrating a semiconductor device according to an embodiment of the present disclosure.

Referring to FIG. 6, in the semiconductor device **100*d*, a lower portion of the barrier layer 184 may protrude toward the metal-semiconductor compound layer 182. According to the process of FIG. 11I to be described later, the lower portion of the barrier layer 184 may have a pointed shape. However, embodiments of the present disclosure are not necessarily limited thereto and the lower portion of the barrier layer 184 may have various shapes. The barrier layer 184 may not be conformal. For example, the thickness of the barrier layer 184 on the bottom side of the barrier layer 184 and the bottom side of the plug conductive layer 186 may be greater than the thickness of the barrier layer 184 on the top side of the plug conductive layer 186. In an embodiment, the metal-semiconductor compound layer may have a first thickness T1 in a central region and a second thickness T2 greater than the first thickness T1** in a peripheral region outside the central region. However, embodiments of the present disclosure are not necessarily limited thereto.

Figure 7:
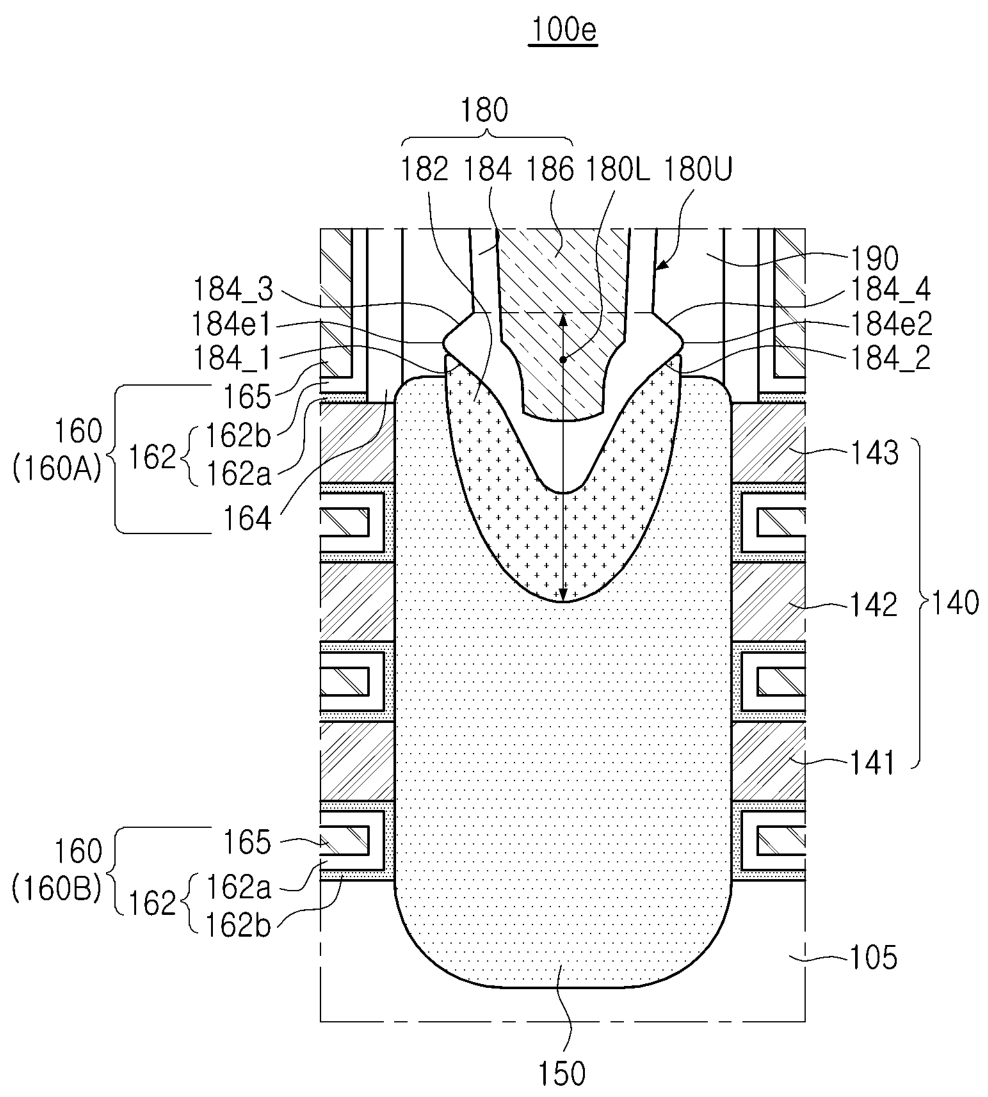
FIG. 7 is a partially enlarged view illustrating a semiconductor device according to an embodiment of the present disclosure.

Referring to FIG. 7, in the semiconductor device **100*e*, a lower portion of the metal-semiconductor compound layer 182 may be formed deeper towards the source/drain region 150 than in an embodiment of FIG. 2A. For this reason, the lower portion of the metal-semiconductor compound layer 182 may be positioned at the same level as the second channel layer 142 among the plurality of channel layers 141, 142, and 143. However, embodiments of the present disclosure are not necessarily limited thereto. In an embodiment, the lower portion of the metal-semiconductor compound layer 182** may have a rounded shape. However, embodiments of the present disclosure are not necessarily limited thereto.

Figure 8:
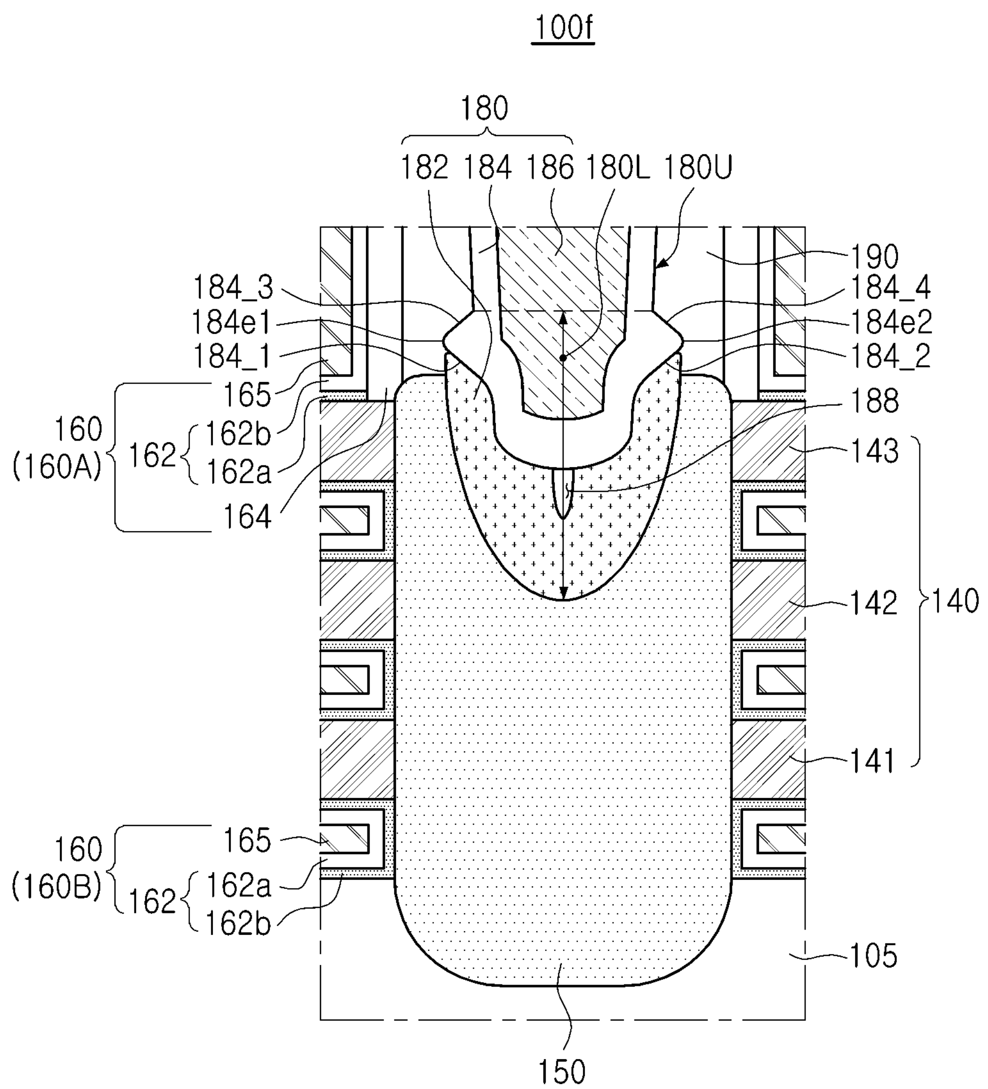
FIG. 8 is a partially enlarged view illustrating a semiconductor device according to an embodiment of the present disclosure.

Referring to FIG. 8, the semiconductor device **100*f* may further include a void 188 between the barrier layer 184 and the metal-semiconductor compound layer 182 in a central portion of the contact plug 180. The void 188 may contain air or a gas formed of a material used in a manufacturing process of the semiconductor device 100*f*. In a process of FIG. 11J described later for forming the barrier layer 184, voids 188** may be formed under the contact holes CH.

Figure 9A:
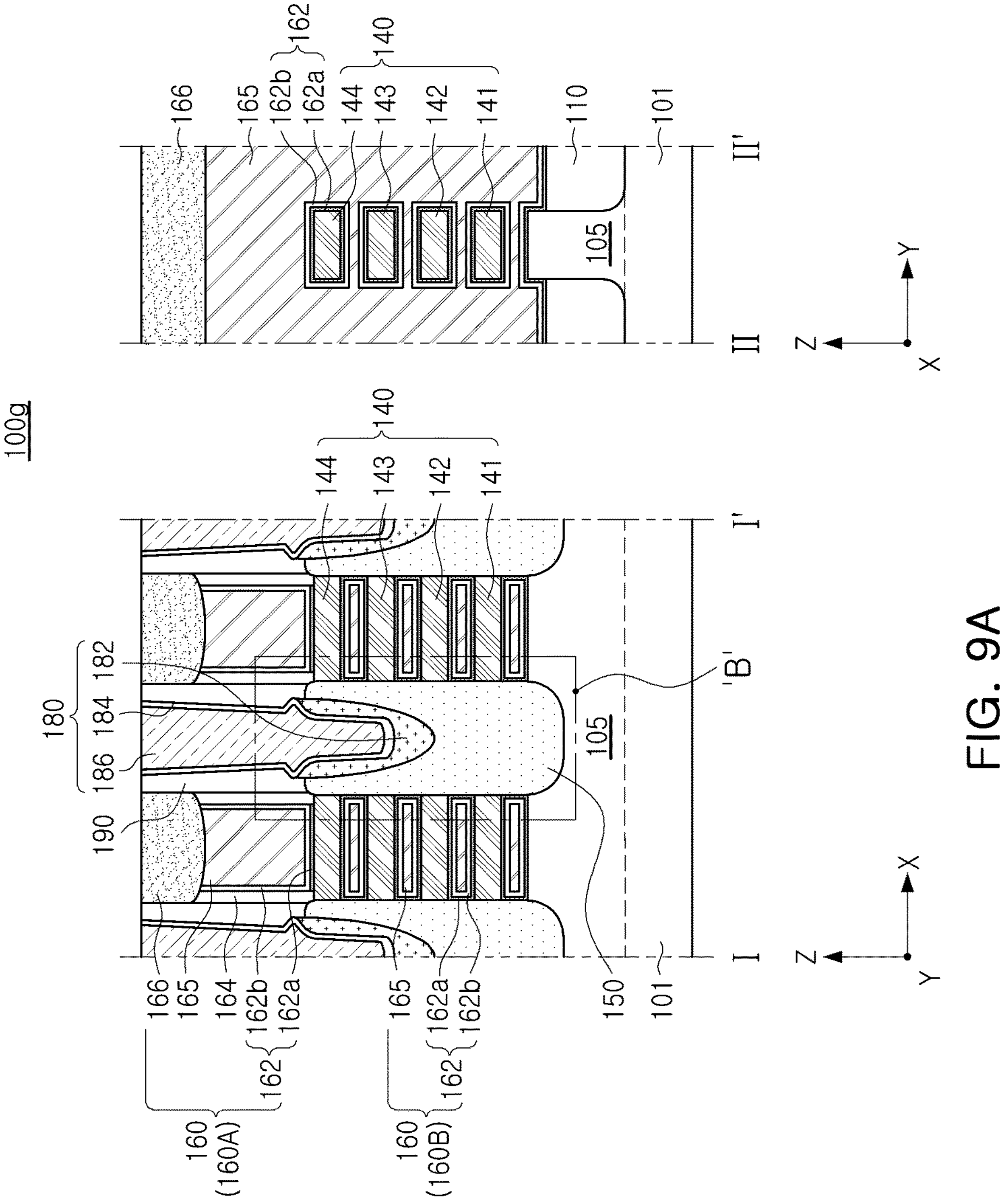
FIG. 9A is a cross-sectional view illustrating a semiconductor device taken along lines I-I' and II-II' of FIG. 1 according to an embodiment of the present disclosure.

FIG. 9A is a cross-sectional view illustrating a semiconductor device according to an embodiment of the present disclosure.

Figure 9B:
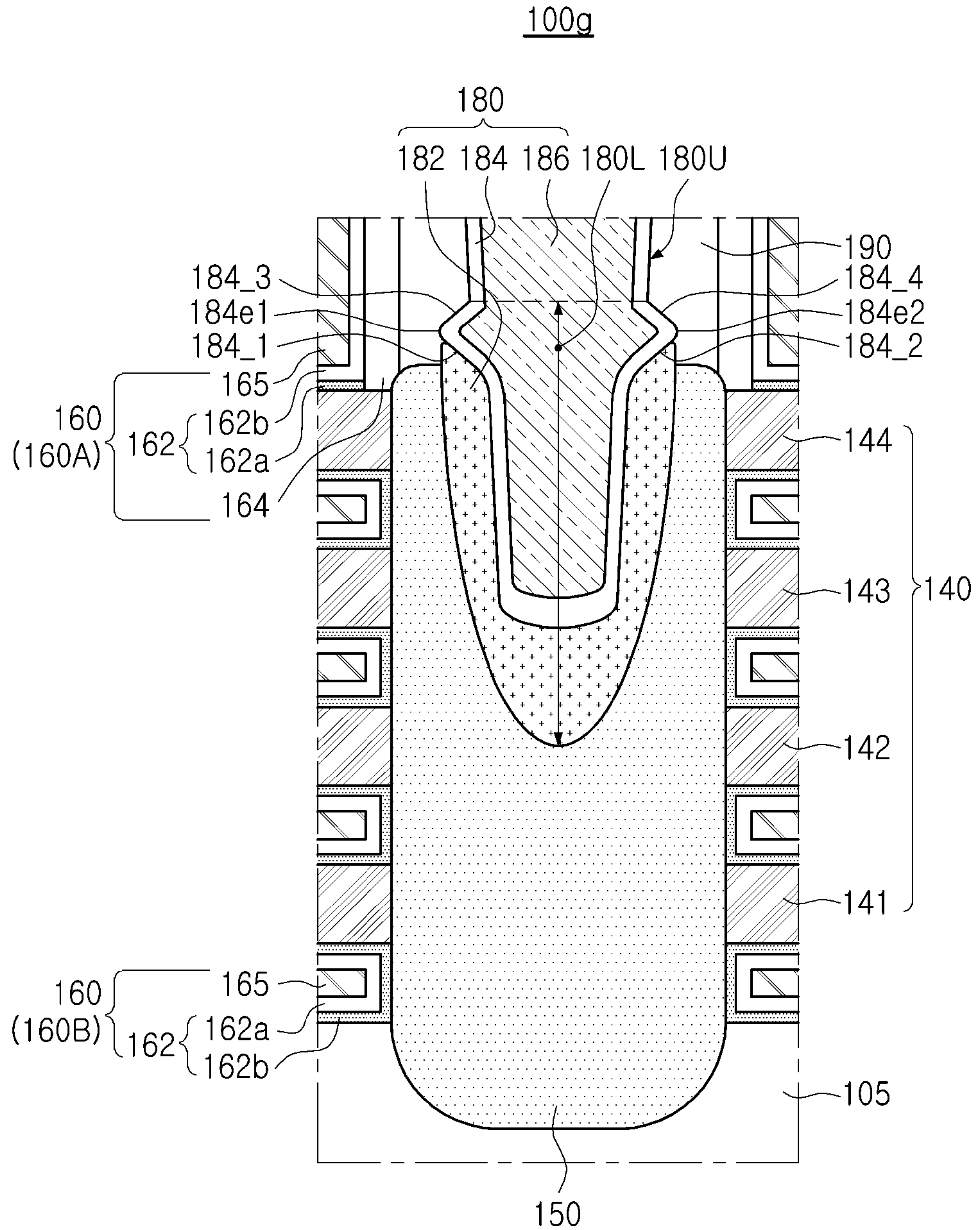
FIG. 9B is a partially enlarged view illustrating a portion of a semiconductor device of area 'B' of FIG. 9A according to an embodiment of the present disclosure.

FIG. 9B is a partially enlarged view illustrating a portion of a semiconductor device according to an embodiment of the present disclosure. 9B is a partially enlarged view illustrating an enlarged portion of a semiconductor device according to an embodiment of the present disclosure. In FIG. 9B, the 'B' region of FIG. 9A is enlarged and illustrated.

Referring to FIGS. 9A and 9B, in the semiconductor device **100*g*, the number of channel layers 141, 142, 143, and 144 constituting one channel structure 140 may be four. The plurality of channel layers 141, 142, 143, and 144 may include the first to fourth channel layers 141, 142, 143, and 144 sequentially disposed in the Z-direction from the active region 105 towards the upper portion 160A of the gate structure 160. Unlike an embodiment described in FIG. 2A, the channel structure 140 may further include a channel layer disposed on the upper surface of the active region 105. Thus, the uppermost channel layer 144 may be the fourth channel layer 144 instead of the above-described third channel layer 143. According to an embodiment, the lowermost portion of the contact plug 180 may be positioned at a lower level than the lower surface of the third channel layer 143. For example, in an embodiment the lowermost portion of the contact plug 180 may be positioned at the same level as or lower than that of the second channel layer 142. For example, the lowermost portion of the metal-semiconductor compound layer 182 may be positioned at a lower vertical level than the upper surface of the second channel layer 142**.

Figure 10:
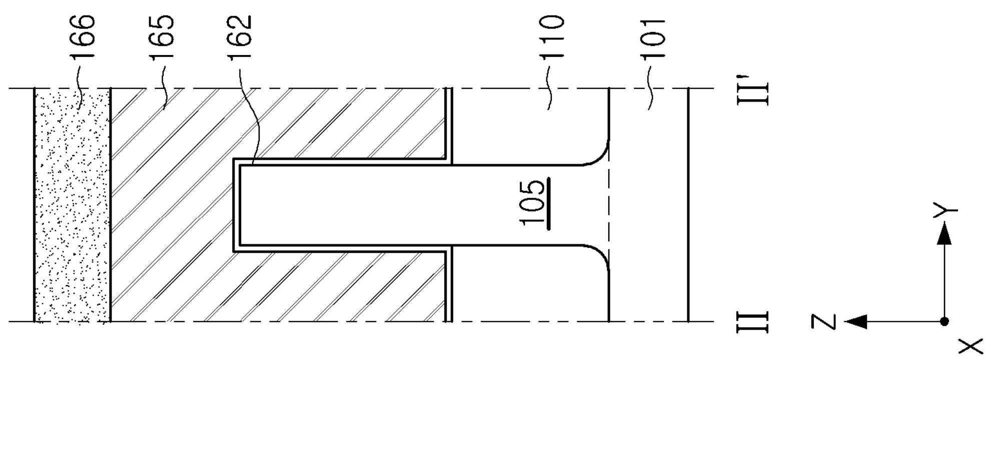
FIG. 10 is a cross-sectional view illustrating a semiconductor device taken along lines I-I' and II-II' of FIG. 1 according to an embodiment of the present disclosure.
Figure 10:
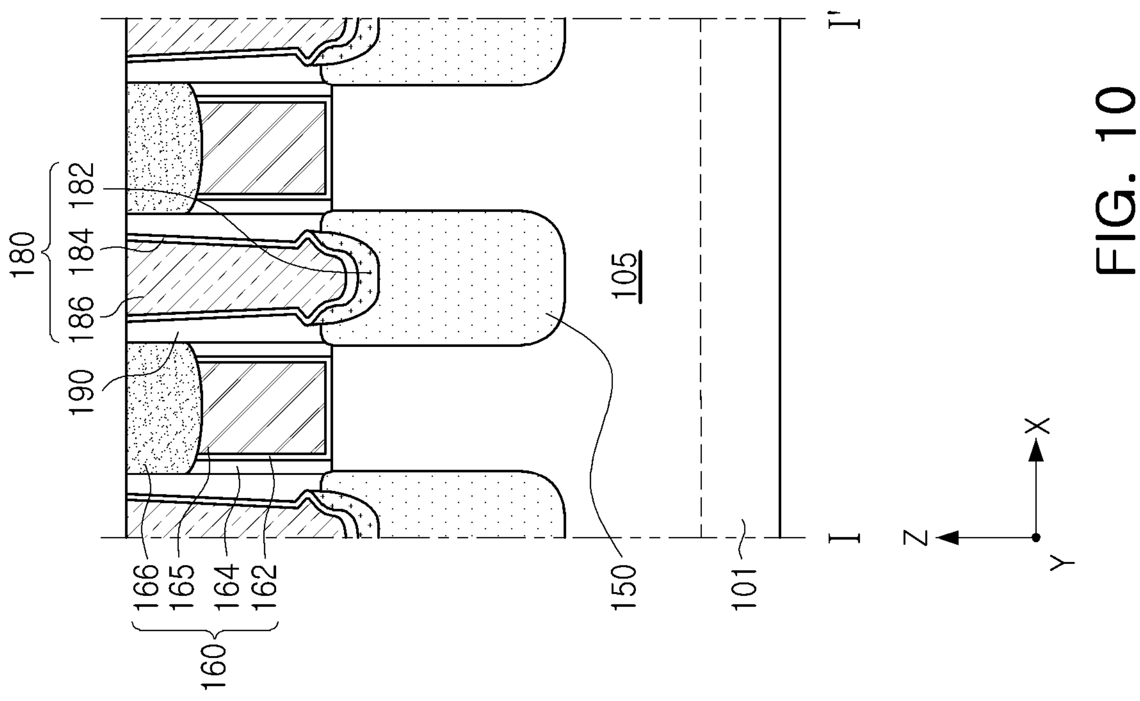

FIG. 10 is a cross-sectional view illustrating a semiconductor device according to an embodiment of the present disclosure.

FIG. 10 illustrates regions corresponding to cross sections cut along cutting lines II-I' and II-II' in FIG. 1. For convenience of explanation, only major components of the semiconductor device are illustrated in FIG. 10. In the following description of an embodiment, a description overlapping with the above description may be omitted for economy of description.

Referring to FIG. 10, the semiconductor device **100*h* may include an active region 105, a device isolation layer 110, a source/drain region 150, a gate structure 160, a contact plug 180, and an interlayer insulating layer 190. The semiconductor device 100*h* may include a finFET device, which is a transistor having a fin structure in the active region 105. A finFET device may include transistors arranged around the active region 105 and the gate structure 160 crossing each other. For example, finFET devices may be NMOS transistors. The above-described embodiments of FIGS. 1 to 9B may also be applied to the semiconductor device 100*h* of an embodiment of FIG. 10**.

FIGS. 11A to 11G are cross-sectional views illustrating a manufacturing method of the semiconductor device 100 according to a process sequence according to embodiments of the present disclosure. 11A to 11G describe embodiments of a manufacturing method for manufacturing the semiconductor device 100 of FIGS. 1 to 2A and illustrate cross-sections corresponding to FIG. 2A.

Figure 11A:
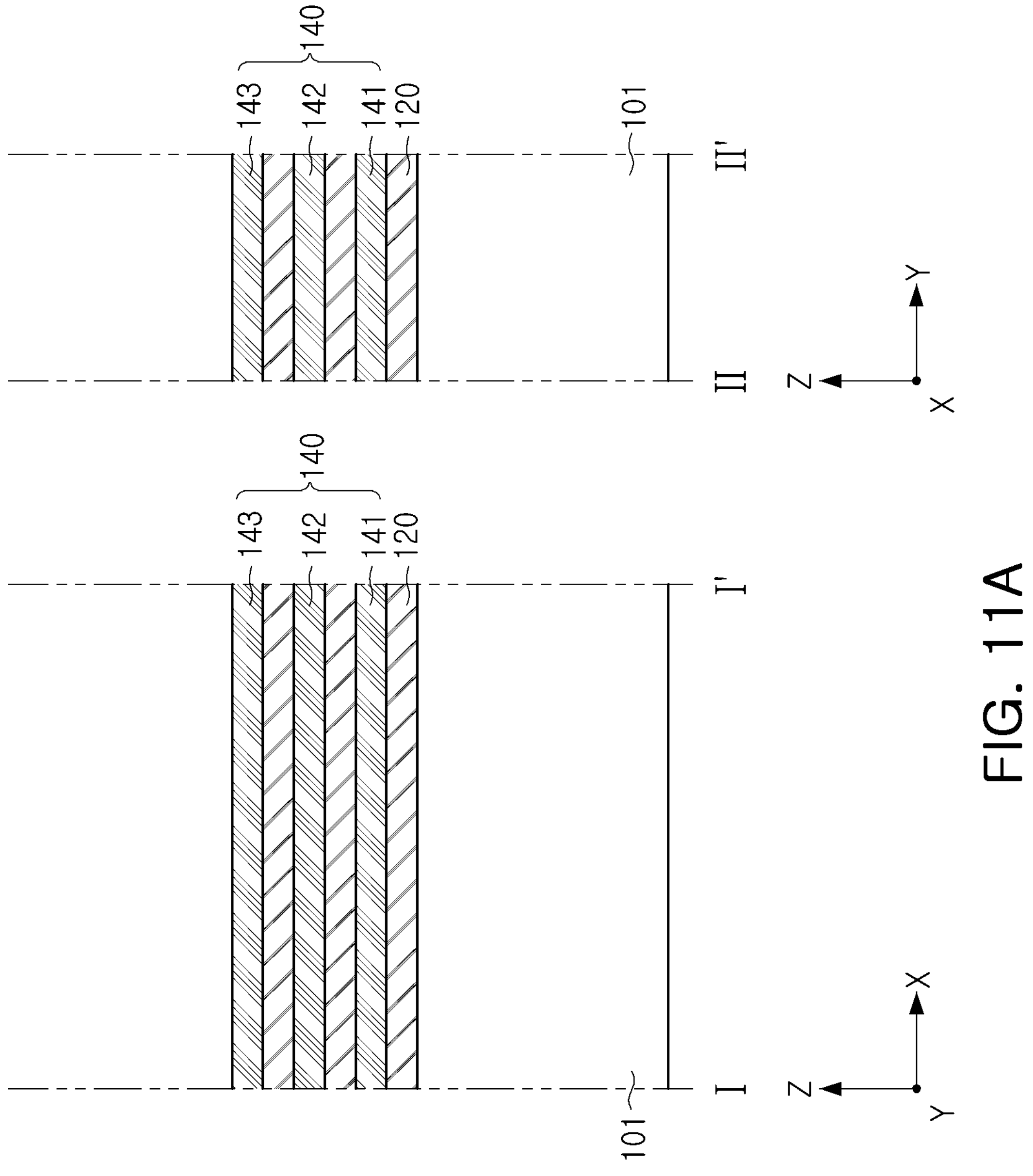
FIGS. 11A, 11B, 11C, 11D, 11E, 11F, 11G, 11H, 11I and 11J are cross-sectional views illustrating a method of manufacturing a semiconductor device taken along lines I-I' and II-II' of FIG. 1 according to a process sequence according to embodiments of the present disclosure.

Referring to FIG. 11A, sacrificial layers 120 and a plurality of channel layers 141, 142, and 143 may be alternately stacked on the active region 105 (e.g., in the Z-direction).

The sacrificial layers 120 may be replaced with the first and second gate dielectric layers **162*a* and 162*b* and the gate electrode 165 as illustrated in FIG. 2A through a subsequent process. In an embodiment, the sacrificial layers 120 may be formed of a material having etch selectivity with respect to the channel layers 141, 142, and 143. The channel layers 141, 142, and 143 may include a material different from that of the sacrificial layers 120. In an embodiment, the channel layers 141, 142, and 143 may include silicon (Si), and the sacrificial layers 120** may include silicon germanium (SiGe). However, embodiments of the present disclosure are not necessarily limited thereto.

In an embodiment, the sacrificial layers 120 and the channel layers 141, 142, and 143 may be formed by performing an epitaxial growth process using the substrate 101 as a seed. In an embodiment, each of the sacrificial layers 120 and the channel layers 141, 142, and 143 may have a thickness in a range of about 1 Å to about 100 nm. The number of layers of the channel layers 141, 142, and 143 alternately stacked with the sacrificial layer 120 may be variously changed in embodiments and not necessarily limited to the number shown in an embodiment of FIG. 11A.

Figure 11B:
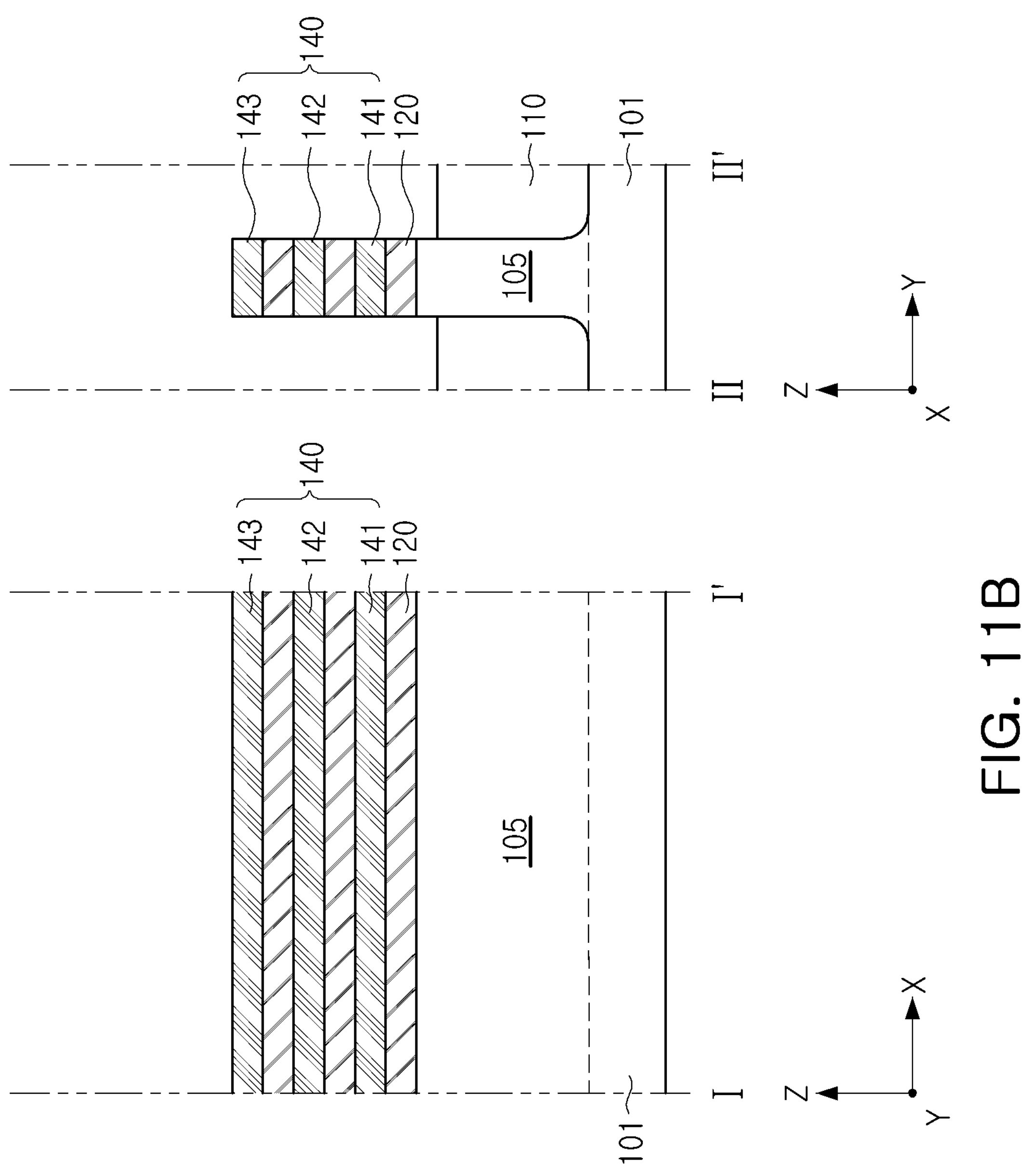

Referring to FIG. 11B, active structures may be formed by removing a portion of the substrate 101 and the laminated structure of the sacrificial layers 120 and the channel layers 141, 142, and 143.

The active structure may include sacrificial layers 120 and a plurality of channel layers 141, 142, and 143 alternately stacked with each other (e.g., in the Z-direction), and may further include an active region 105 formed so that a portion of the substrate 101 is removed and protrudes from the upper surface of the substrate 101 (e.g., in the Z-direction). In an embodiment, the active structures may be formed in a line shape extending in one direction, for example, the X-direction, and may be spaced apart from each other in the Y-direction. Depending on the aspect ratio, the active area 105 may have an inclined shape such that the width increases while facing the bottom.

In an embodiment, the device isolation layers 110 may be formed in the region where a portion of the substrate 101 is removed by filling an insulating material and then recessing the insulating material so that the active region 105 protrudes from the device isolation layers 110. Upper surfaces of the device isolation layers 110 may be lower than upper surfaces of the active regions 105.

Figure 11C:
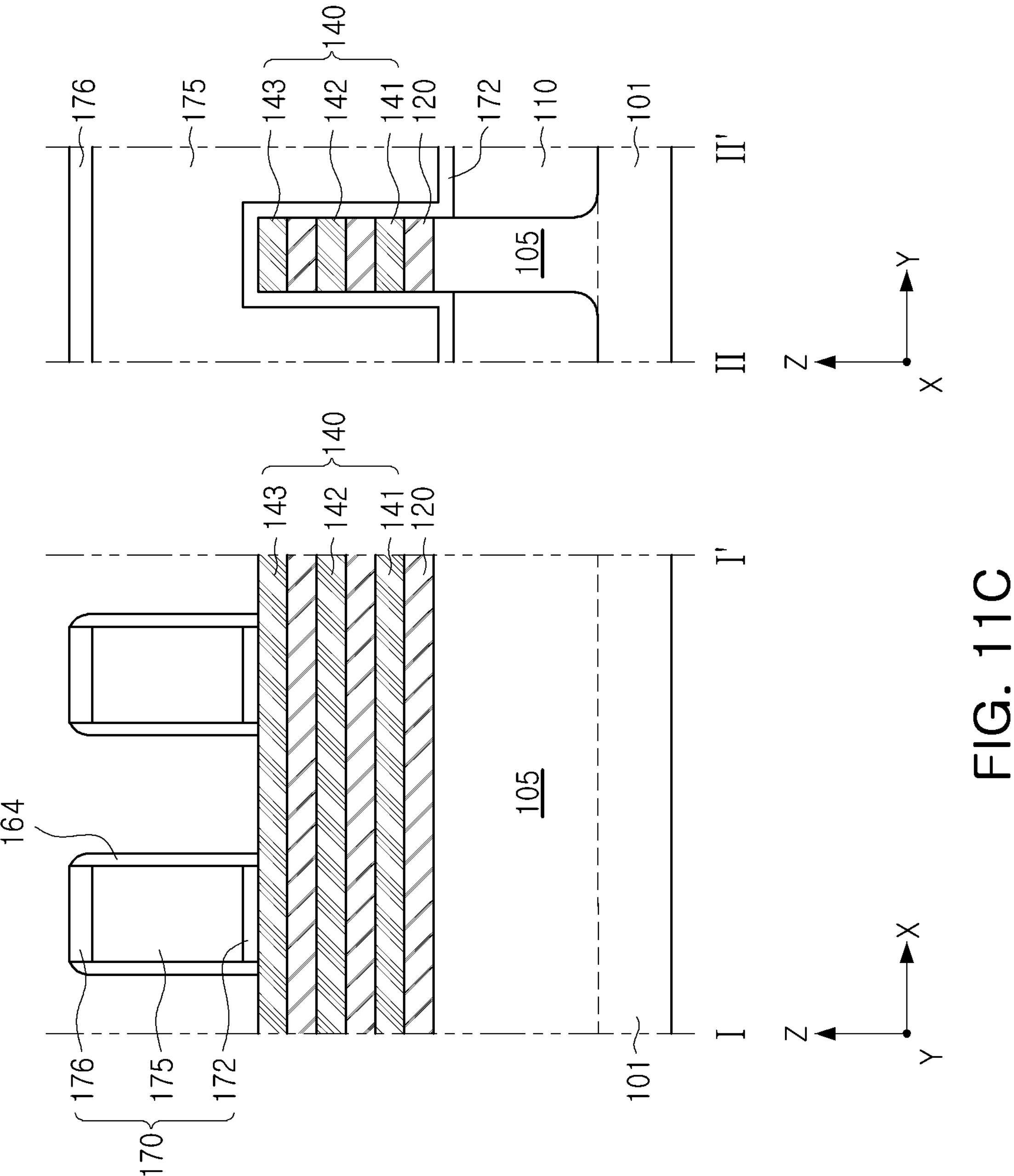

Referring to FIG. 11C, sacrificial gate structures 170 and gate spacer layers 164 may be formed on the active structures.

As illustrated in FIG. 2A, through the subsequent process, the sacrificial gate structures 170 may be the sacrificial structure formed in the region where the first and second gate dielectric layers **162*a* and 162*b* and the gate electrode 165 are disposed above the plurality of channel layers 141, 142, and 143. In an embodiment, the sacrificial gate structures 170 may include first and second sacrificial gate layers 172 and 175 and a mask pattern layer 176 that are sequentially stacked (e.g., in the Z-direction). The first and second sacrificial gate layers 172 and 175 may be patterned using the mask pattern layer 176. In an embodiment, the first and second sacrificial gate layers 172 and 175 may be an insulating layer and a conductive layer, respectively. For example, in an embodiment the first sacrificial gate layer 172 may include silicon oxide, and the second sacrificial gate layer 175 may include polysilicon. The mask pattern layer 176 may include silicon nitride. The sacrificial gate structures 170 may have a line shape extending in one direction crossing the active structures. For example, the sacrificial gate structures 170** may extend in the Y-direction and be spaced apart from each other in the X-direction.

Gate spacer layers 164 may be formed on both sidewalls of the sacrificial gate structures 170. In an embodiment, the gate spacer layers 164 may be formed by anisotropic etching after forming a film having a uniform thickness along the upper and side surfaces of the sacrificial gate structures 170 and the active structures. In an embodiment, the gate spacer layers 164 may be formed of a low-κ material, and for example, may include at least one of SiO, SiN, SiCN, SiOC, SiON, and SiOCN. However, embodiments of the present disclosure are not necessarily limited thereto.

Figure 11D:
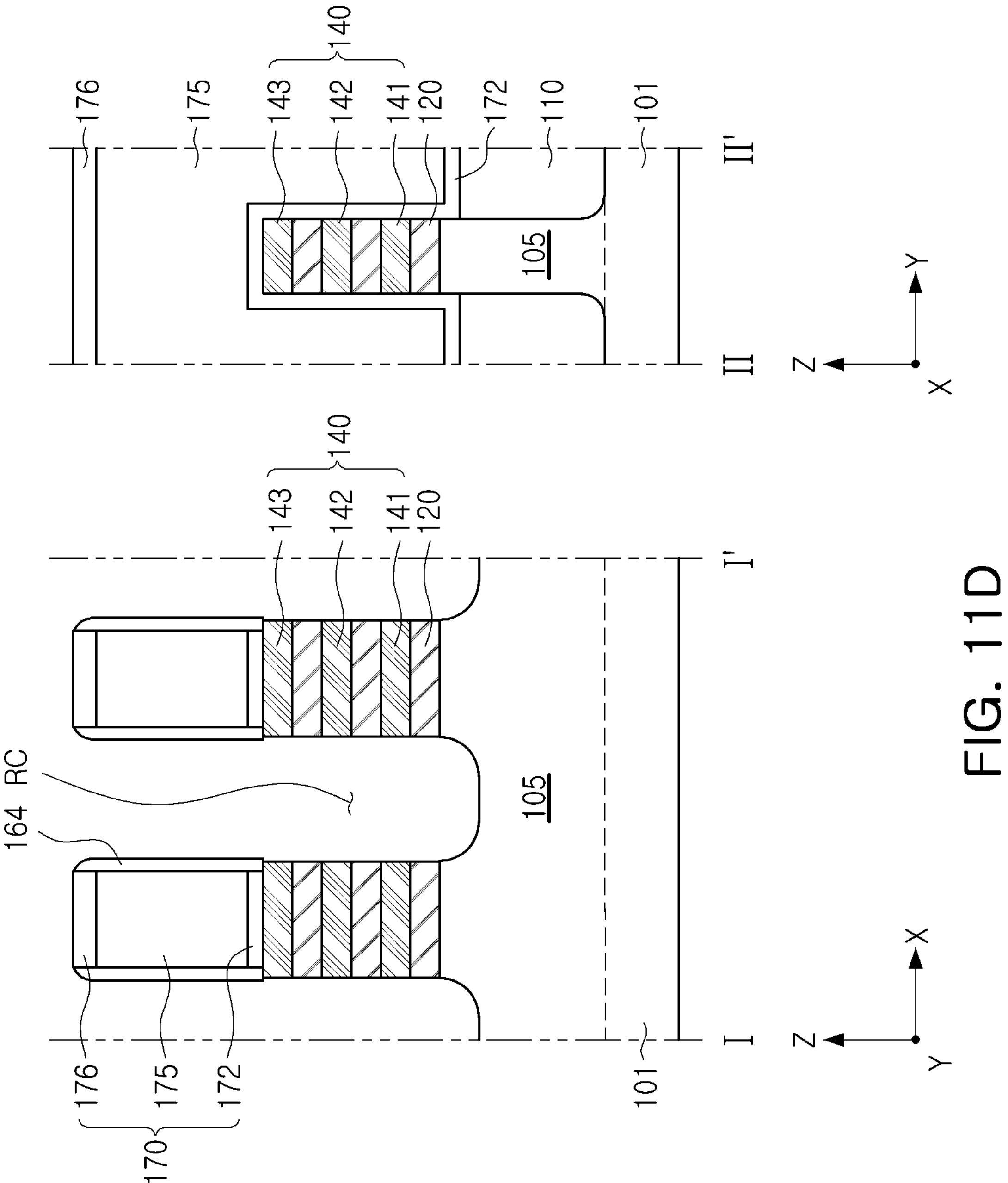

Referring to FIG. 11D, between the sacrificial gate structures 170 (e.g., in the X-direction), the exposed sacrificial layers 120 and the plurality of channel layers 141, 142, and 143 are partially removed to form a recess region RC, and a plurality of channel layers 141, 142, 143 and the active region 105 may be partially removed.

A recess region RC may be formed by removing portions of the exposed sacrificial layers 120 and the plurality of channel layers 141, 142, and 143, using the sacrificial gate structures 170 and the gate spacer layers 164 as masks. In an embodiment, the recess process may be formed by, for example, sequentially applying a dry etching process and a wet etching process. First, the recess region RC may be formed in a vertical direction through a dry etching process. Next, the recess region RC may be formed in a horizontal direction through a wet etching process. Accordingly, the plurality of channel layers 141, 142, and 143 may have a limited length in the X-direction. However, the specific shapes of the side surfaces of the plurality of channel layers 141, 142, and 143 and the top of the active region 105 are not necessarily limited to those illustrated in FIG. 11D.

Figure 11E:
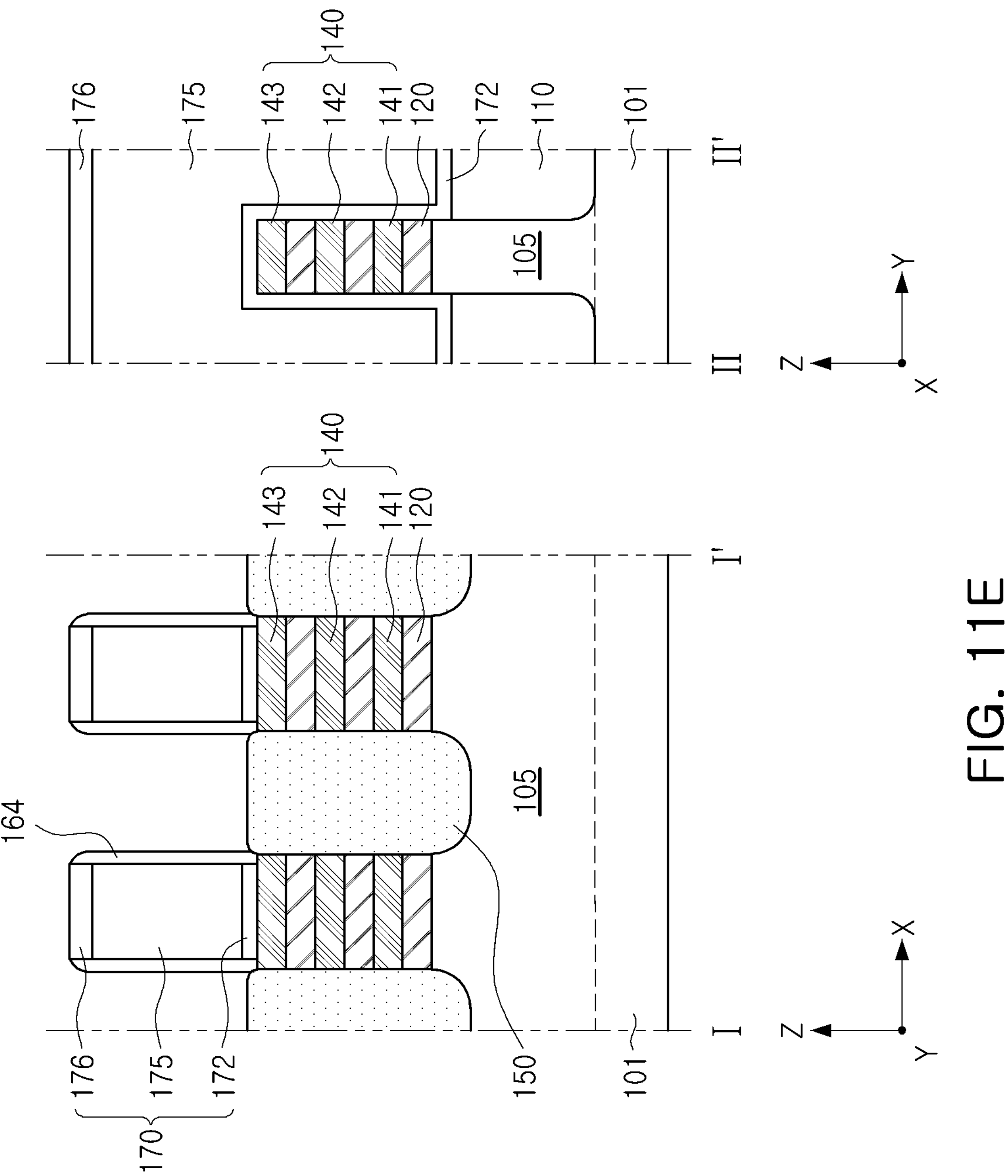

Referring to FIG. 11E, an epitaxial layer of the source/drain region 150 may be formed to fill the recess region RC.

The source/drain regions 150 may be formed by an epitaxial growth process. In an embodiment, the source/drain regions 150 may be formed by repeating epitaxial growth and etching processes, and may extend to directly contact the plurality of channel layers 141, 142, and 143, such as side surfaces of the plurality of channel layers 141, 142, 143 and the lower portion 160B of the gate structures 160. In an embodiment, a surface of the source/drain region 150 facing the plurality of channel layers 141, 142, and 143 and the sacrificial layers 120 may also have a wavy shape. The source/drain regions 150 may include impurities by in-situ doping. The upper surfaces of the source/drain regions 150 may be substantially the same as or higher than the lower surfaces of the upper portions 160A of the gate structures 160. However, embodiments of the present disclosure are not necessarily limited thereto.

Figure 11F:
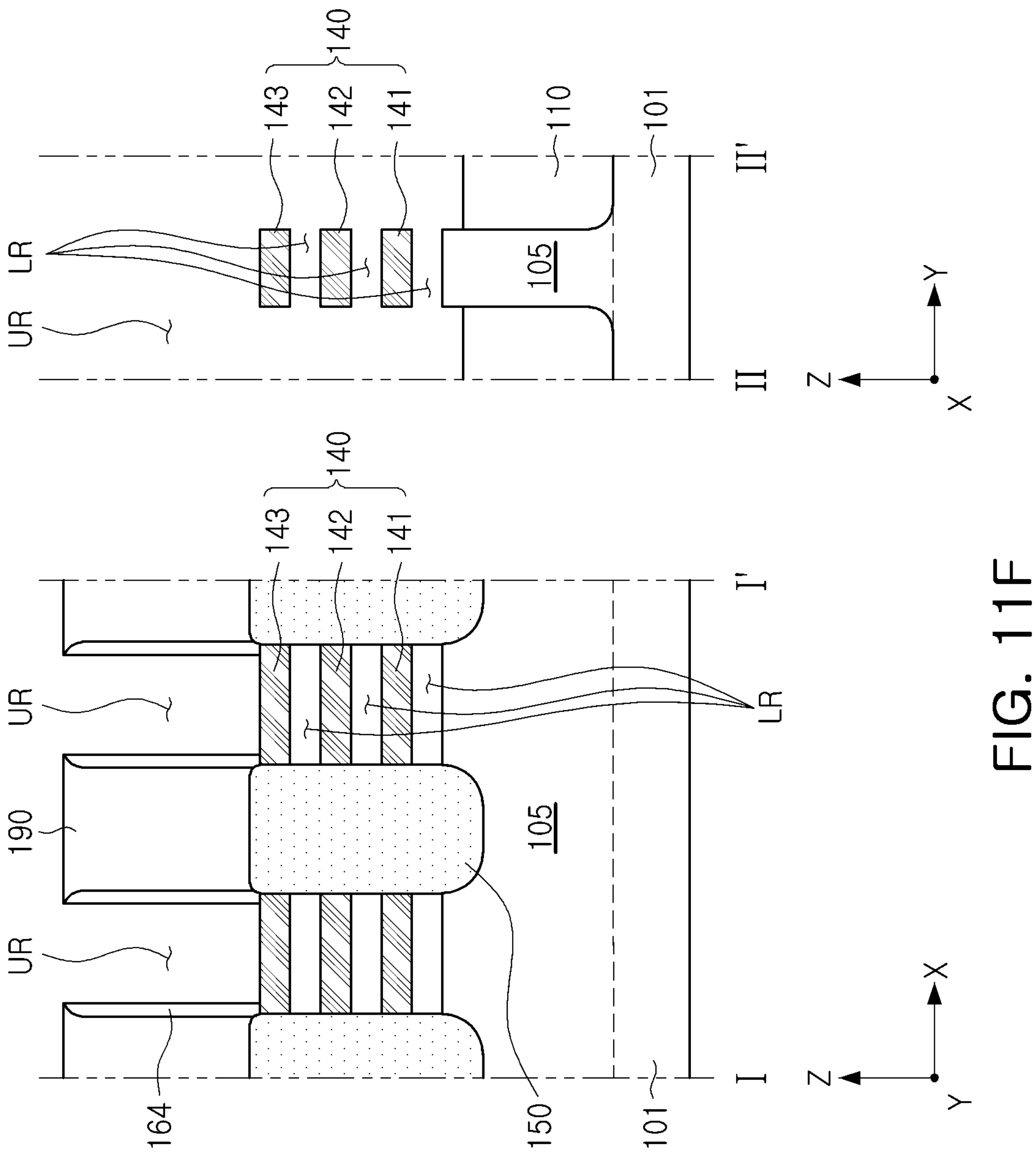

Referring to FIG. 11F, an interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150 and performing a planarization process.

The sacrificial layers 120 and the sacrificial gate structures 170 may be selectively removed with respect to the gate spacer layers 164, the interlayer insulating layer 190, and the plurality of channel layers 141, 142, and 143. In an embodiment, after the sacrificial gate structures 170 are removed to form the upper gap regions UR, lower gap regions LR may then be formed by removing the sacrificial layers 120 exposed through the upper gap regions UR. For example, in an embodiment in which the sacrificial layers 120 include silicon germanium (SiGe) and the plurality of channel layers 141, 142, and 143 include silicon (Si), the sacrificial layers 120 may be selectively removed by performing a wet etching process using peracetic acid and/or a solution ($NH_4OH$:$H_2O_2$:$H_2O$=1:1.5) used in the Standard clean-1 (SC1) cleaning process as an etchant. However, embodiments of the present disclosure are not necessarily limited thereto.

Figure 11G:
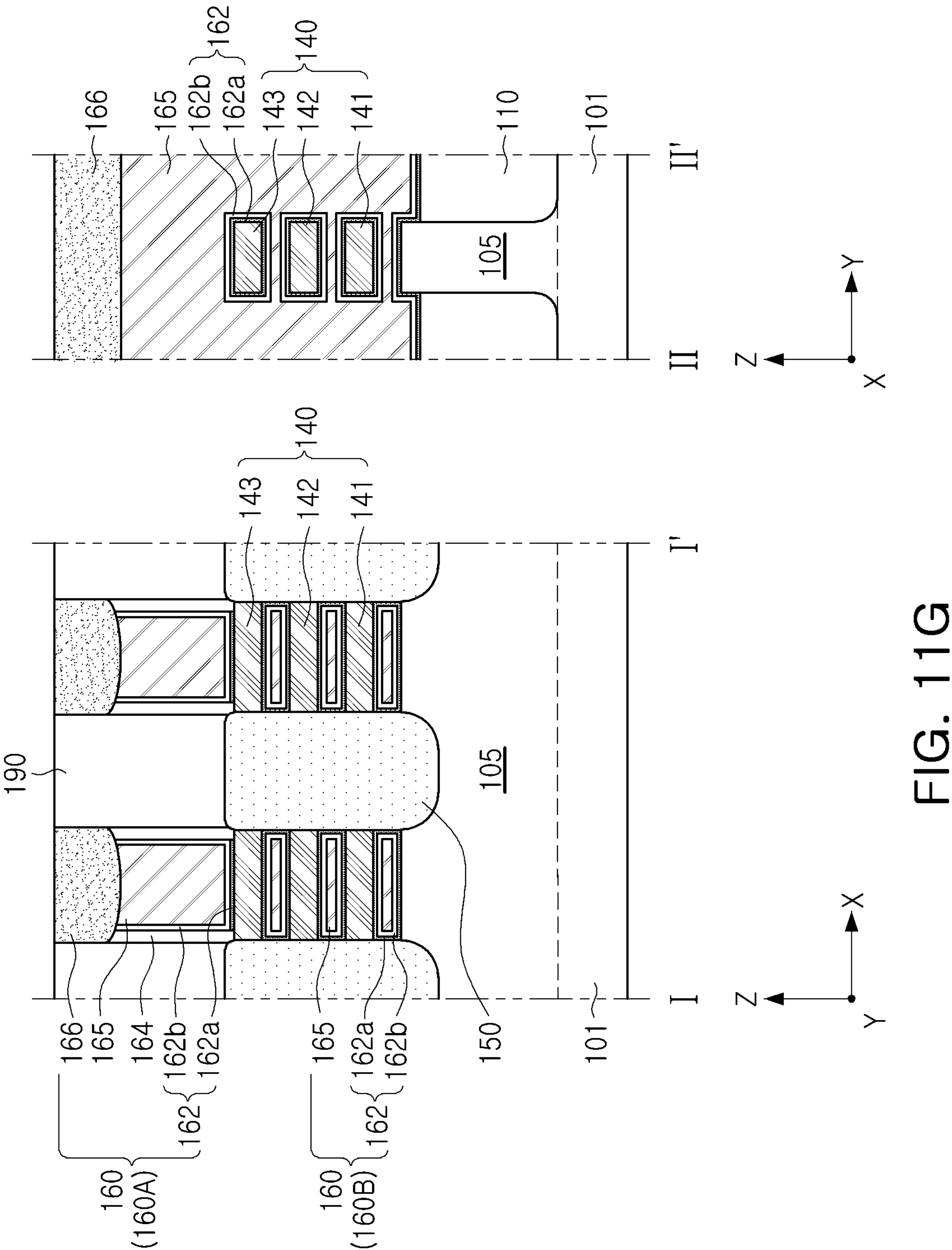

Referring to FIG. 11G, a gate structure 160 may be formed in the upper gap regions UR and the lower gap regions LR.

The first and second gate dielectric layers 162*a* and 162*b* may be formed to conformally cover inner surfaces of the upper gap regions UR and the lower gap regions LR. The gate electrode 165 may be formed to fill the upper gap regions UR and lower gap regions LR. The gate electrode 165 and the gate spacer layers 164 may be removed to a predetermined depth from the top of the upper gap regions UR. A gate capping layer 166 may be formed in a region from which the gate electrode 165 and the gate spacer layers 164 are removed in the upper gap regions UR. Therefore, the gate structure 160 including first and second gate dielectric layers 162*a* and 162*b*, the gate electrode 165, gate spacer layers 164, and the gate capping layer 166 may be formed.

Figure 11H:
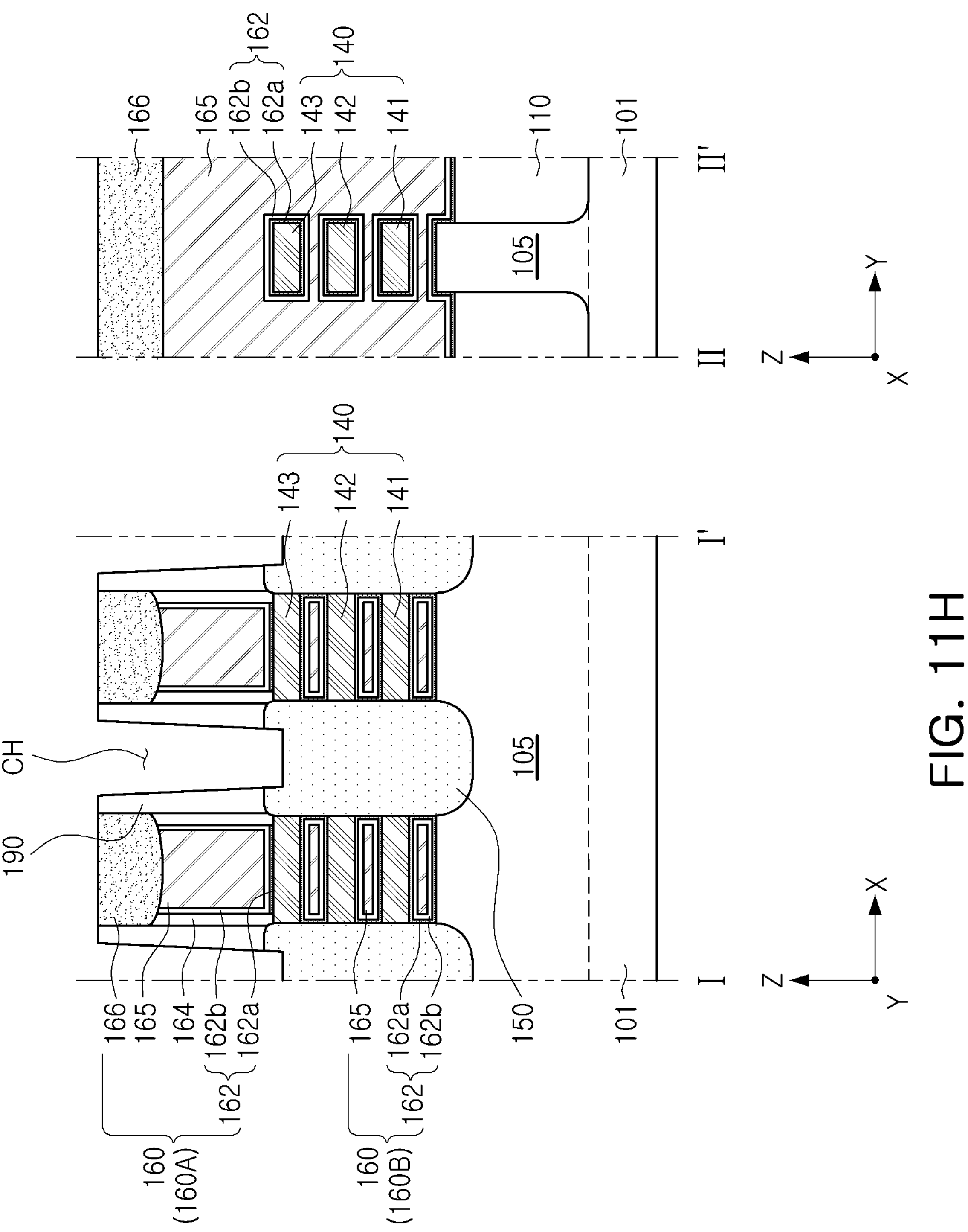
Figure 11I:
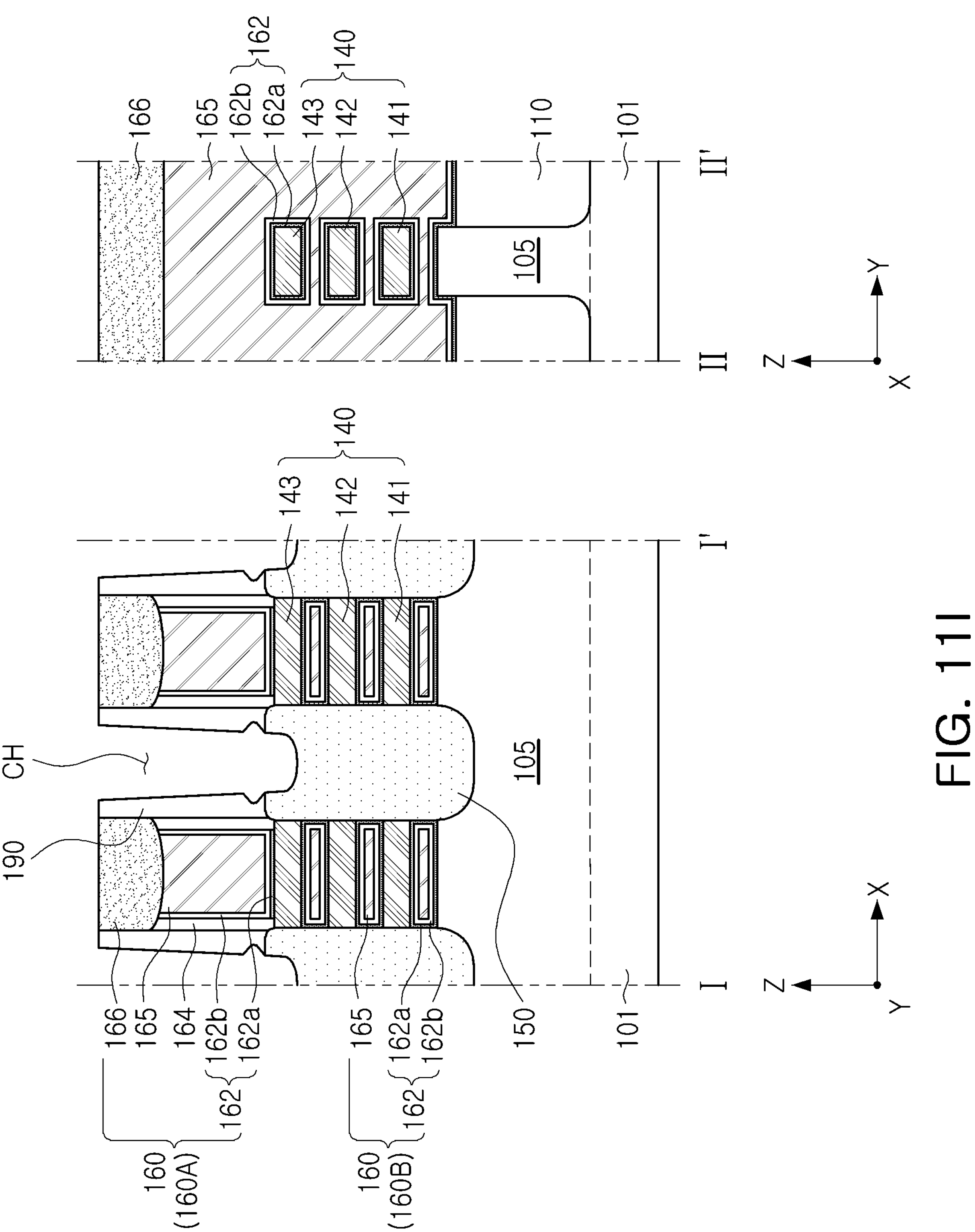
Figure 11J:
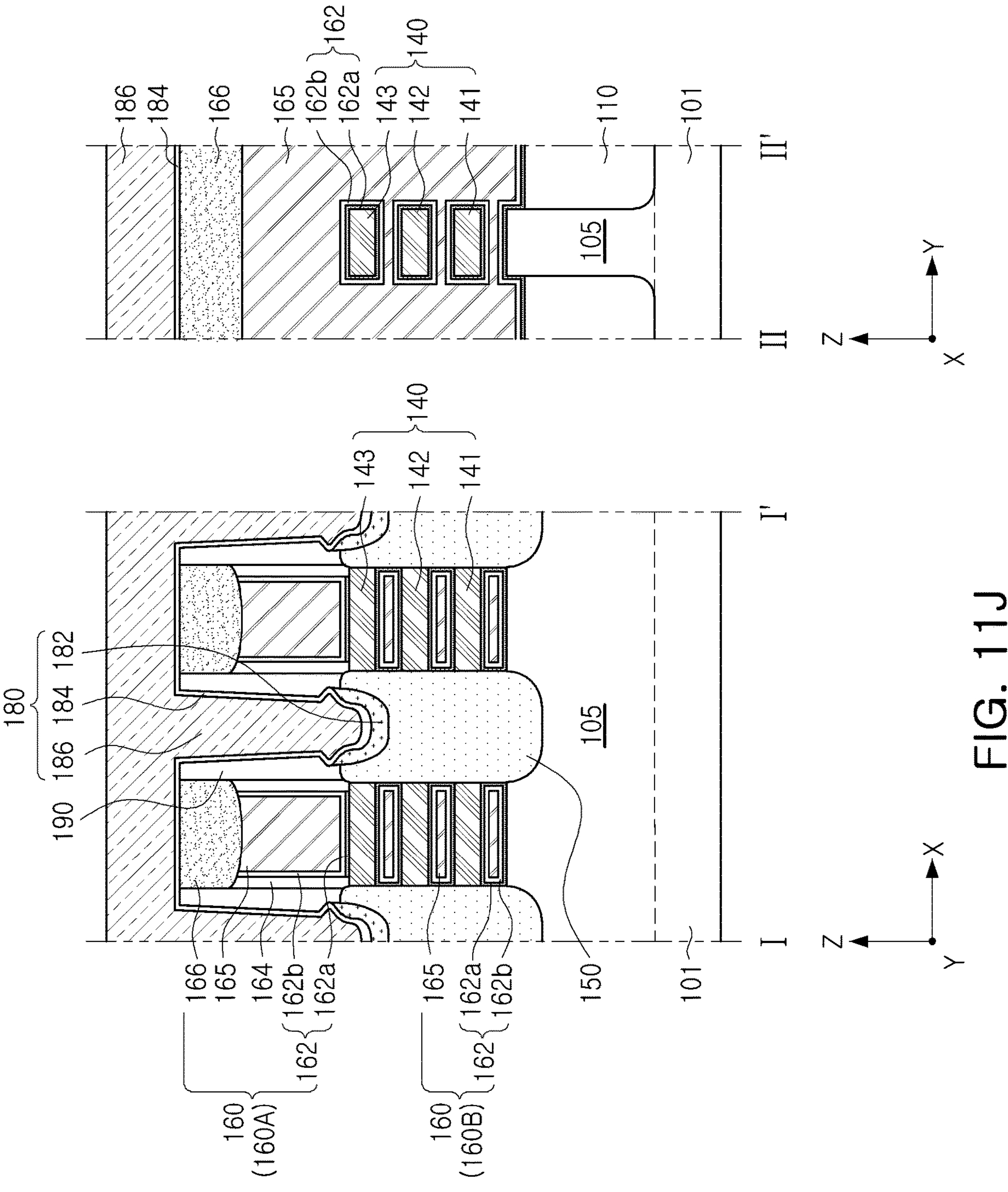

Referring to FIGS. 11H to 11J, a contact plug 180 may be formed.

In an embodiment as shown in FIG. 11H, contact holes CH exposing the source/drain regions 150 may be formed. Bottom surfaces of the contact holes CH may be recessed into the source/drain regions 150.

In an embodiment as shown in FIG. 11I, the insulating material of the recess region RC may then be removed using a chemical oxide removal (COR) process. In an embodiment, for the chemical oxide removal (COR) process, for example, a mixed gas of hydrogen fluoride (HF) and ammonia ($NH_3$) gas may be used. As a result, a portion of the interlayer insulating layer 190 may be removed. In addition, a purge step may be performed by supplying $H_2$ gas to form protruding portions toward the gate structure 160 on the sidewalls of the contact holes CH. By purging the $H_2$ gas, in addition to forming the protruding portion, inner surfaces of the contact holes CH may be cured.

As illustrated in FIG. 11J, a contact plug 180 may be formed. The contact plug 180 may include a metal-semiconductor compound layer 182 disposed at the bottom, a barrier layer 184 disposed along the sidewalls, and a plug conductive layer 186.

In an embodiment, after depositing a material constituting the barrier layer 184, a process such as a silicide process is performed, a metal-semiconductor compound layer 182 may be formed on a portion of the bottom and side surfaces of the contact holes CH. According to the silicide process, the thickness of the metal-semiconductor compound layer 182 may be adjusted. The uppermost portion of the metal-semiconductor compound layer 182 may be positioned on a level higher than the upper surface of the source/drain region 150 and/or the uppermost surface of the uppermost channel layer 143 among the plurality of channel layers 141, 142, and 143.

A conductive material may then be deposited to fill the contact holes CH to form the plug conductive layer 186.

Referring to FIG. 2A, in an embodiment the contact plugs 180 may be separated by performing a planarization process. Due to this, the semiconductor device 100 of embodiments of FIGS. 1 to 2B may be manufactured.

As set forth above, according to an embodiment of the present disclosure, a semiconductor device having increased electrical characteristics and reliability may be provided by including a structure in which a contact area between a contact plug and a source/drain region is increased.

While embodiments of the present disclosure have been illustrated and described above, it will be apparent to those skilled in the art that modifications and variations could be made without departing from the scope of the present disclosure.

What is claimed is:

1. A semiconductor device comprising:

an active region on a substrate, the active region extending in a first direction parallel to an upper surface of the substrate;

a plurality of channel layers on the active region, the plurality of channel layers are spaced apart from each other in a vertical direction perpendicular to the upper surface of the substrate;

a gate structure on the substrate and extending in a second direction parallel to the upper surface of the substrate and crossing the first direction, the gate structure crossing the active region and the plurality of channel layers, the gate structure respectively enclosing the plurality of channel layers;

a source/drain region on the active region on at least one side of the gate structure and directly contacting the plurality of channel layers; and a contact plug connected to the source/drain region, wherein the contact plug includes a metal-semiconductor compound layer directly contacting the source/drain region, a barrier layer on the metal-semiconductor compound layer, and a plug conductive layer on the barrier layer, the contact plug includes a first inclined surface and a second inclined surface positioned where the metal-semiconductor compound layer and the barrier layer directly contact each other, the barrier layer includes a first end and a second end protruding towards the gate structure on an outer side surface, the first end and the second end are positioned at a level higher than an upper surface of an uppermost channel layer among the plurality of channel layers, and an uppermost portion of the metal-semiconductor compound layer is positioned at a level higher than an upper surface of the source/drain region.

2. The semiconductor device of claim 1, wherein the first inclined surface and the second inclined surface are inclined with respect to the upper surface of the source/drain region.

3. The semiconductor device of claim 1, wherein the first end and the second end have a rounded shape, or a pointed shape.

4. The semiconductor device of claim 1, wherein the first end and the second end are disposed on the uppermost portion of the metal-semiconductor compound layer.

5. The semiconductor device of claim 1, wherein the first inclined surface is connected to the first end, and the second inclined surface is connected to the second end.

6. The semiconductor device of claim 1, wherein the first end and the second end are positioned at a level higher than the upper surface of the source/drain region.

7. The semiconductor device of claim 1, wherein the plug conductive layer includes protruding regions corresponding to the first end and the second end.

8. The semiconductor device of claim 1, further comprising a void containing air positioned between the barrier layer and the metal-semiconductor compound layer.

9. The semiconductor device of claim 1, wherein:

the plurality of channel layers include first to fourth channel layers sequentially disposed in the vertical direction from the active region towards the gate structure, and a lowermost portion of the contact plug is positioned at a level lower than a lower surface of the third channel layer.

10. The semiconductor device of claim 1, wherein the first end and the second end are positioned at different levels from each other.

11. The semiconductor device of claim 1, further comprising an interlayer insulating layer covering the source/drain region, wherein the contact plug includes a third inclined surface and a fourth inclined surface positioned where the barrier layer and the interlayer insulating layer directly contact each other, the first end is positioned where the first inclined surface and the third inclined surface meet each other, and the second end is positioned where the second inclined surface and the fourth inclined surface meet each other.

12. The semiconductor device of claim 11, wherein the first end and the second end are spaced apart from the gate structure by the interlayer insulating layer.

13. The semiconductor device of claim 12, wherein the third inclined surface and the fourth inclined surface have an inclined surface with respect to the upper surface of the source/drain region.

14. A semiconductor device comprising:

an active region on a substrate, the active region extending in a first direction parallel to an upper surface of the substrate;

a plurality of channel layers on the active region, the plurality of channel layers are spaced apart from each other in a vertical direction perpendicular to the upper surface of the substrate;

a gate structure on the substrate and extending in a second direction parallel to the upper surface of the substrate and crossing the first direction, the gate structure crossing the active region and the plurality of channel layers, the gate structure respectively enclosing the plurality of channel layers;

a source/drain region on the active region on at least one side of the gate structure and directly contacting the plurality of channel layers; and a contact plug connected to the source/drain region, wherein the contact plug includes a metal-semiconductor compound layer directly contacting the source/drain region, a barrier layer on the metal-semiconductor compound layer, and a plug conductive layer on the barrier layer, the barrier layer includes a first end and a second end protruding towards the gate structure on an outer side surface, the first end and the second end are positioned at a level higher than an upper surface of the source/drain region, and an uppermost portion of the metal-semiconductor compound layer is positioned at a level higher than the upper surface of an uppermost channel layer among the plurality of channel layers.

15. The semiconductor device of claim 14, wherein:

the contact plug includes a lower portion including the first end and the second end and an upper portion disposed on the lower portion; and a width of a lowermost portion of the upper portion in the first direction is less than a width between the first end and the second end.

16. The semiconductor device of claim 15, wherein along the vertical direction, the barrier layer includes a portion having a width between outer side surfaces of the barrier layer that gradually increases from a lower end to a level of the first end and the second end and gradually decreases from a level higher than the first end and the second end towards an uppermost portion of the barrier layer.

17. The semiconductor device of claim 14, wherein the first end and the second end have a pointed shape.

18. The semiconductor device of claim 14, wherein the first end and the second end are positioned a level higher than an upper surface of an uppermost channel layer among the plurality of channel layers.

19. A semiconductor device comprising:

an active region on a substrate, the active region extending in a first direction parallel to an upper surface of the substrate;

a gate structure on the substrate and extending in a second direction parallel to the upper surface of the substrate and crossing the first direction, the gate structure crossing the active region;

a source/drain region on the active region on at least one side of the gate structure; and a contact plug connected to the source/drain region, wherein the contact plug includes a metal-semiconductor compound layer directly contacting the source/drain region, a barrier layer, and a plug conductive layer on the barrier layer, the barrier layer includes a first end and a second end protruding towards the gate structure on an outer side surface, the first end and the second end are positioned at a level higher than the upper surface of the source/drain region, the metal-semiconductor compound layer has a first thickness in a central region, and a second thickness less than the first thickness in a peripheral region outside of the central region, and the contact plug has a maximum width in the first direction between the first end and the second end.

20. The semiconductor device of claim 1, wherein the contact plug has a maximum width in the first direction between the first end and the second end.

* * * * *